United States Patent
Do et al.

(10) Patent No.: US 10,062,804 B2
(45) Date of Patent: Aug. 28, 2018

(54) METHOD OF MANUFACTURING NANO-SCALE LED ELECTRODE ASSEMBLY COMPRISING SELECTIVE METAL OHMIC LAYER

(71) Applicant: PSI Co., Ltd., Yongin-si, Gyeonggi-do (KR)

(72) Inventors: Young Rag Do, Seoul (KR); Yeon Goog Sung, Gyeonggi-do (KR)

(73) Assignee: PSI CO., LTD., Gyeonggi-do (KR)

( * ) Notice: Subject to any disclaimer, the term of this patent is extended or adjusted under 35 U.S.C. 154(b) by 0 days.

(21) Appl. No.: 15/355,015

(22) Filed: Nov. 17, 2016

(65) Prior Publication Data
US 2017/0141279 A1    May 18, 2017

(30) Foreign Application Priority Data
Nov. 17, 2015 (KR) .................. 10-2015-0161300

(51) Int. Cl.
*H01L 21/00* (2006.01)
*H01L 33/00* (2010.01)
*B23K 26/00* (2014.01)

(52) U.S. Cl.
CPC .......... *H01L 33/0075* (2013.01); *B23K 26/00* (2013.01); *H01L 33/0079* (2013.01)

(58) Field of Classification Search
CPC .. H01L 33/0075; H01L 33/0079; B23K 26/00
See application file for complete search history.

(56) References Cited

U.S. PATENT DOCUMENTS

| 9,773,761 B2 * | 9/2017 | Do ..................... H01L 25/0753 |
| 2014/0246648 A1 * | 9/2014 | Im ........................ H01L 33/382 |
| | | 257/13 |

FOREIGN PATENT DOCUMENTS

| KR | 1020110122948 A | 11/2011 |
| KR | 1020110133244 A | 12/2011 |
| KR | 1020120122159 A | 11/2012 |
| KR | 1020150006798 A | 1/2015 |

* cited by examiner

*Primary Examiner* — Richard Booth
(74) *Attorney, Agent, or Firm* — Masuvalley & Partners

(57) ABSTRACT

A method of manufacturing a nano-scale LED electrode assembly including a selective metal ohmic layer is disclosed. Specifically, the method can be useful in increasing conductivity between a nano-scale LED device and electrodes and also reducing contact resistance therebetween by depositing a conductive material in a region in which the nano-scale LED device comes in contact with the electrodes so as to improve the contact between the nano-scale LED device and the electrodes, thereby further improving light extraction efficiency of the nano-scale LED device.

14 Claims, 13 Drawing Sheets

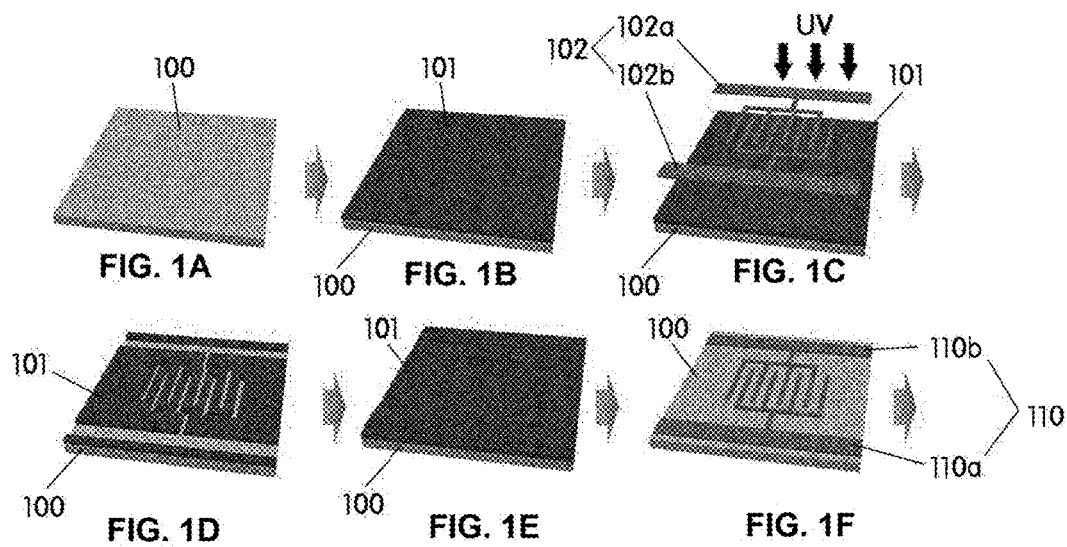
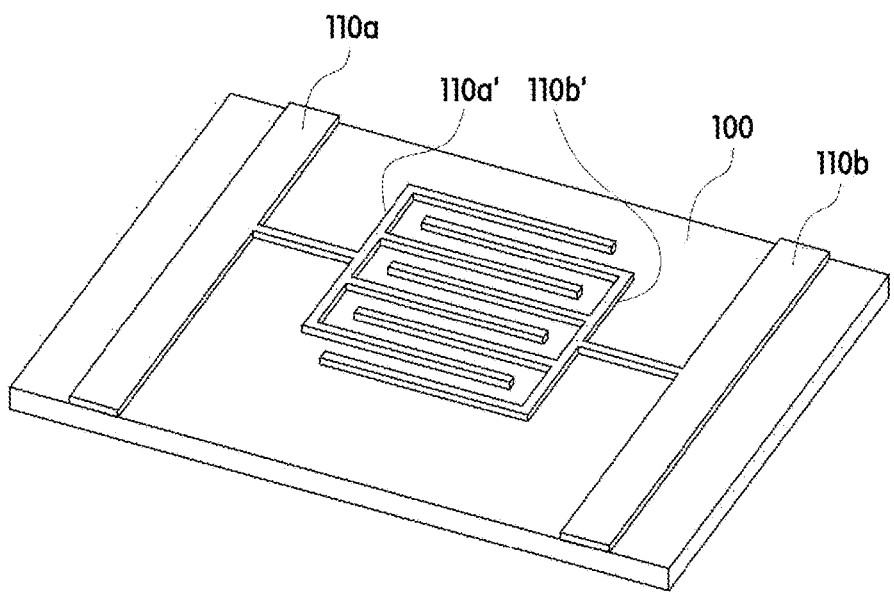

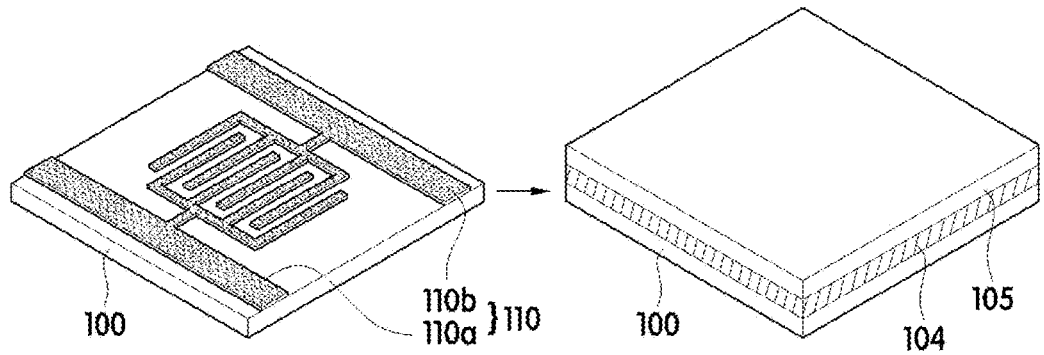
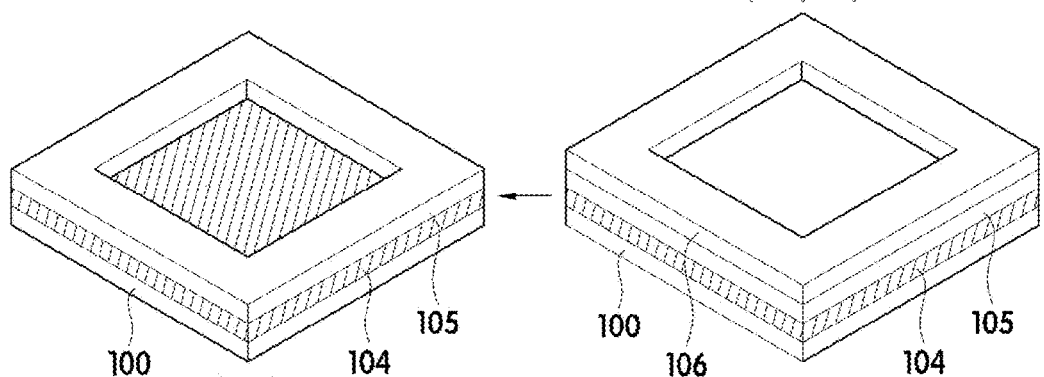
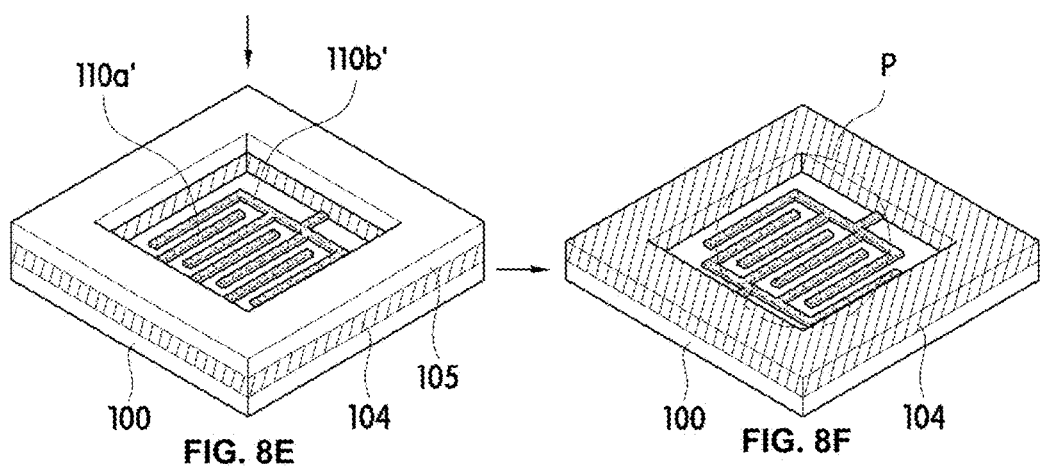

METHOD OF MANUFACTURING NANO-SCALE LED ELECTRODE ASSEMBLY COMPRISING SELECTIVE METAL OHMIC LAYER

CROSS-REFERENCE TO RELATED APPLICATION

This application claims priority to and the benefit of Korean Patent Application No. 10-2015-0161300, filed on Nov. 17, 2015, the disclosure of which is incorporated herein by reference in its entirety.

BACKGROUND

1. Field of the Invention

The present invention relates to a method of manufacturing a nano-scale LED electrode assembly including a selective metal ohmic layer, and more particularly, to a method of manufacturing a nano-scale LED electrode assembly including a selective metal ohmic layer, which is capable of increasing conductivity between electrodes and a nano-scale LED device and also reducing contact resistance therebetween.

2. Discussion of Related Art

The development of light emitting diodes (LEDs) has been facilitated since 1992 when Nakamura et al. from Nichia Chemical Corporation (Japan) succeeded in fusing a high-quality single-crystal gallium nitride (GaN) semiconductor by applying a low-temperature GaN compound buffer layer. An LED is a semiconductor device having a structure in which n-type semiconductor crystals having a plurality of carriers, i.e., electrons, and p-type semiconductor crystals having a plurality of carriers, i.e., holes, are joined using the characteristics of a compound semiconductor, that is, a semiconductor device that converts an electrical signal into light having a wavelength band at a desired region to emit the light.

Such an LED semiconductor is called a revolution of light as a green material because the LED semiconductor has very low energy consumption due to high light conversion efficiency, has a semi-permanent lifespan and is environmentally friendly. With the current development of compound semiconductor technology, red, orange, green, blue, and white LEDs having high brightness have been developed. Also, the LEDs have been applied to various fields such as traffic lights, mobile phones, headlights for vehicles, outdoor electronic display boards, LED backlight units (BLUs), and indoor/outdoor lightings, and thus research on the LEDs is still being actively conducted. In particular, a GaN-based compound semiconductor material having a wide band gap is a material that has been used to manufacture LED semiconductors which emit green and blue light and ultraviolet rays. Since it is possible to manufacture white LED devices using blue LED devices, much research on such a manufacturing method has been conducted.

Owing to the application of the LED semiconductor to various fields and the research on the LED semiconductor, LED semiconductors having high power output are also needed, and thus it is very important to improve efficiency of the LED semiconductor. However, there are several difficulties in manufacturing the blue LED device having high efficiency and high power output.

The difficulties in improving the efficiency of the blue LED device may result from the difficulty in a manufacturing process and a high refractive index of the manufactured LED between the GaN-based semiconductor and the atmosphere.

First, the difficulty in the manufacturing process may be due to the difficulty in manufacturing a substrate having the same lattice constant as the GaN-based semiconductor. A GaN epitaxial layer formed on the substrate has a drawback in that many defects may occur when the lattice constant of the epitaxial layer is significantly mismatched with that of the substrate, resulting in lowered efficiency and performance.

Next, light emitted from an active layer of the LED does not escape to the outside but is totally reflected to the inside of the LED due to the high refractive index of the manufactured blue LED between the GaN-based semiconductor and the atmosphere. Such totally reflected light may be reabsorbed inside of the LED, resulting in deteriorated efficiency of the LED. Such efficiency may be referred to light extraction efficiency of an LED device. To solve the above problems, much research is being conducted.

Meanwhile, to make use of the LED device in lightings, displays, and the like, an LED device and an electrode for applying power to the LED device are required. Also, research on an arrangement of the LED device and two different electrodes in connection with an application purpose, a decrease in a space occupied by the electrodes, or a manufacturing method has been variously conducted.

Research on the arrangement of the LED device and the electrodes may be classified into a method of growing an LED device on electrodes and a method of separately growing an LED device and arranging the LED device on electrodes.

First, in research on growing the LED device on the electrodes, there is a bottom-up method in which the LED device and the electrodes are formed and arranged at the same time through a series of manufacturing processes using a method which includes forming a lower electrode on a substrate in the form of a thin film, and sequentially stacking an n-type semiconductor layer, an active layer, a p-type semiconductor layer, and an upper electrode on the lower electrode and etching the stacked layers, or etching the previously stacked layers prior to stacking the upper electrode and then stacking the upper electrode.

Next, the method of separately and independently growing an LED device and arranging the LED device on electrodes is a method including independently growing LED devices using a separate process, and then arranging the manufactured LED devices on patterned electrodes one by one.

The former method has a problem in that it is very difficult to grow a high-crystalline/high-efficiency thin film and an LED device in a crystallographic aspect, and the latter has a problem in that light emitting efficiency may be deteriorated due to low light extraction efficiency.

Also, the latter method has a problem in that a three-dimensional (3D) LED device may be erected and connected to electrodes in case of the conventional LED devices, but it is very difficult to erect a 3D LED device on electrodes when the LED device is an LED device having a nano-scale size. Korean Patent Application No. 2011-0040174 filed by the inventor of this application discloses a coupling linker for promoting coupling of a nano-scale LED device having a nano-scale size to electrodes in a state in which the LED device is coupled to the electrodes in a 3D erect state. In fact, however, it is very difficult to couple the nano-scale LED device to the electrodes in the 3D erect state when utilizing nano-scale electrodes.

Further, the separately manufactured LED devices have to be arranged one by one on the patterned electrodes. However, when the size of the LED devices is very small (e.g., a nano-scale size), the LED devices have drawbacks in that it is very difficult to arrange the LED devices on two different nano-scale electrodes within a desired range, and defects often occur due to electrical short circuits between the electrodes and the nano-scale LEDs even when the LED devices are disposed on the two different nano-scale electrodes, which makes it impossible to realize a desired electrode assembly.

Also, Korean Patent Application No. 2010-0042321 discloses a structure of an address electrode line for LED modules and a method of manufacturing the same. In case of this application, a lower electrode is formed on a substrate in the form of a thin film, and an insulation layer and an upper electrode are sequentially stacked on the lower electrode, and then etched to manufacture an electrode line. Then, an LED chip is mounted on the upper electrode. However, when the mounted LED chip has a nano-scale size, it is very difficult to accurately mount the 3D LED chip on the upper electrode in an erect state. Even when the LED chip is mounted on the upper electrode, it is also difficult to connect the mounted LED chip having the nano size to the lower electrode.

Further, when the separately mounted LED devices are disposed on the electrodes to apply power to the electrodes, contact resistance between the LED devices and the electrodes occurs, resulting in degraded light extraction efficiency.

SUMMARY OF THE INVENTION

To solve the above problems, the present invention is directed to a method of manufacturing a nano-scale LED electrode assembly including a selective metal ohmic layer, which is capable of increasing conductivity between electrodes and an LED device and also reducing contact resistance therebetween by depositing a conductive material in a region in which the LED device comes in contact with the electrodes so as to improve the contact between the LED device and the electrodes.

According to an aspect of the present invention, there is provided a method of manufacturing a nano-scale LED electrode assembly including a selective metal ohmic layer, which includes (1) manufacturing a nano-scale LED electrode assembly by self-aligning nano-scale LED devices on an electrode line including first and second electrodes which are formed on a base substrate to be spaced apart from each other; and (2) forming a metal ohmic layer on the nano-scale LED electrode assembly by immersing the nano-scale LED electrode assembly in an electroplating solution and applying a power source to one of the first and second electrodes of the nano-scale LED electrode assembly to perform an electroplating process for a plating time ($T_1$) of 1 to 300 minutes.

According to one preferred embodiment of the present invention, the method may further include (3) forming a metal ohmic layer on the nano-scale LED electrode assembly by applying a power source to the other electrode, to which the power source is not applied in operation 2, to perform an electroplating process for a plating time ($T_2$) satisfying the following Mathematical Expression 1:

$$1 \text{ Minute} \leq \text{Plating time } T_2 \leq T_1 \quad \text{[Mathematical Expression 1]}$$

wherein $T_1$ represents a plating time required for the electroplating process in operation 2.

According to another preferred embodiment of the present invention, the power source in operation 2 may be applied in the form of pulse waves having a voltage of −0.2 to −1.0 V, and the power source of the pulse waves may be applied for 0.05 to 30 seconds and paused for 0.05 to 30 seconds.

According to still another preferred embodiment of the present invention, the power source in operation 3 may be applied in the form of pulse waves having a voltage of −0.2 to −1.0 V, and the power source of the pulse waves may be applied for 0.05 to 30 seconds and paused for 0.05 to 30 seconds.

According to yet another preferred embodiment of the present invention, the electroplating solution may include at least one metal precursor selected from the group consisting of a gold precursor, a silver precursor, a copper precursor, and a platinum precursor.

According to yet another preferred embodiment of the present invention, the electroplating solution may include the metal precursor at a concentration of 0.001 to 100 mM.

According to yet another preferred embodiment of the present invention, operation 1 may include (1-1) injecting a dispersion solution including a dispersion solvent and nano-scale LED devices toward one surface of the base substrate on which the electrode line including the first and second electrodes spaced apart from each other is formed; and (1-2) manufacturing the nano-scale LED electrode assembly by applying the power source to the electrode line to self-align the nano-scale LED devices. Here, the manufactured nano-scale LED electrode assembly may be thermally annealed at 600° C. to 1,000° C. for 0.5 to 10 minutes.

According to yet another preferred embodiment of the present invention, the first and second electrodes in operation 1 may be either spirally or interdigitatedly disposed to be spaced apart from each other.

According to yet another preferred embodiment of the present invention, each of the nano-scale LED devices may include a first electrode layer; a first conductive semiconductor layer formed on the first electrode layer; an active layer formed on the first conductive semiconductor layer; a second conductive semiconductor layer formed on the active layer; and a second electrode layer formed on the second conductive semiconductor layer, and each of the nano-scale LED devices may further include an outer surface thereof coated with an insulating coating film.

According to yet another preferred embodiment of the present invention, the insulating coating film may be applied to cover the entire outer surface of the active layer.

According to yet another preferred embodiment of the present invention, outer surfaces of the first and second electrode layers of the nano-scale LED devices may not be coated with the insulating coating film.

According to yet another preferred embodiment of the present invention, the plating time ($T_1$) in operation 2 may be in a range of 10 to 55 minutes.

According to yet another preferred embodiment of the present invention, a width X of the first electrode, a width Y of the second electrode, a distance Z between the first electrode and the second electrode adjacent to the first electrode, and a height H of the nano-scale LED devices may satisfy the following Relation 1:

$$0.5Z \leq H < X+Y+2Z \quad \text{[Relation 1]}$$

wherein 100 nm<X≤10 μm, 100 nm<Y≤10 μm, and 100 nm<Z≤10 μm.

According to yet another preferred embodiment of the present invention, each of the nano-scale LED devices may further include an insulating barrier formed on the base substrate in operation 1 to surround a region of the electrode line in which the plurality of nano-scale LED devices are positioned.

According to yet another preferred embodiment of the present invention, after operation 3, the manufactured nano-scale LED electrode assembly may be thermally re-annealed at 600° C. to 1,000° C. for 0.5 to 10 minutes.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIGS. 1A through 1F are perspective view showing processes of a method of manufacturing an electrode line according to one preferred embodiment of the present invention;

FIG. 2 is a perspective view of an electrode line including first and second electrodes formed on a base substrate according to one preferred embodiment of the present invention;

FIGS. 8A through 8F are perspective view showing manufacturing processes for forming an insulating barrier on a base substrate according to one preferred embodiment of the present invention;

DETAILED DESCRIPTION OF EXEMPLARY EMBODIMENTS

Figure 3:
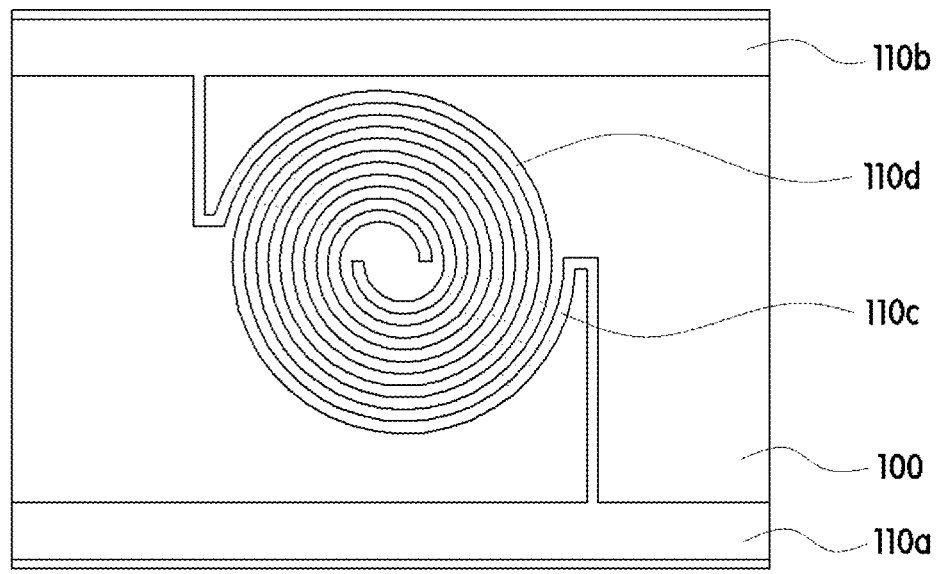
FIG. 3 is a plan view of the electrode line including the first and second electrodes formed on the base substrate according to one preferred embodiment of the present invention.

Exemplary embodiments of the present invention will be described in detail below with reference to the accompanying drawings. While the present invention is shown and described in connection with exemplary embodiments thereof, it will be apparent to those skilled in the art that various modifications can be made without departing from the scope of the invention.

Unless specifically stated otherwise, all the technical and scientific terms used in this specification have the same meanings as what are generally understood by a person skilled in the related art to which the present invention belongs. In general, the nomenclatures used in this specification and the experimental methods described below are widely known and generally used in the related art.

In the description of the exemplary embodiments of the present invention, when it is assumed that individual layers, regions, patterns or structures are formed "on," "over," "above," "under," "beneath," or "below" individual substrates, layers, regions, or patterns, it will be understood that the terms "on," "over," "above," "under," "beneath," and "below" has meanings encompassing both "directly" and "indirectly."

Also, in the description of the exemplary embodiments of the present invention, the terms "first electrode" and "second electrode" refer to electrodes included in an electrode region in which nano-scale LEDs may be substantially mounted, or an electrode region which may be further included in addition to the electrode region according to a method of disposing electrodes on a base substrate.

In addition, a nano-scale LED electrode assembly according to one exemplary embodiment of the present invention refers to an electrode region in which nano-scale LED devices may be substantially mounted, and nano-scale LED devices mounted in the electrode region.

Further, in the description of the exemplary embodiments of the present invention, the term "unit electrode" refers to an arrangement region in which two electrodes are disposed to arrange and independently drive nano-scale LED devices, and the term "area" of the unit electrode refers to an area of the arrangement region.

Hereinafter, the present invention will be described in further detail with reference to the accompanying drawings.

As described above, as one of methods of manufacturing an LED electrode assembly, in a method including separately and independently growing LED devices and then arranging the LED devices on electrodes, there is a need to arrange the separate LED devices manufactured through a separate process on patterned electrode one by one. However, when the independently grown LED devices are arranged on the electrodes to apply a power source to the electrodes, contact resistance between the LED devices and the electrodes may occur, resulting in degraded light emitting efficiency due to degraded light extraction efficiency.

Accordingly, the present invention seeks to solve the above problems by providing a method of manufacturing a nano-scale LED electrode assembly including a selective metal ohmic layer, which includes (1) manufacturing a nano-scale LED electrode assembly by self-aligning nano-scale LED devices on an electrode line including first and second electrodes which are formed on a base substrate to be spaced apart from each other; and (2) forming a metal ohmic layer on the nano-scale LED electrode assembly by immersing the nano-scale LED electrode assembly in an electroplating solution and applying a power source to one of the first and second electrodes of the nano-scale LED electrode assembly to perform an electroplating process for a plating time $T_1$ of 1 to 300 minutes.

In this way, a conductive material may be deposited in a region in which the LED devices come in contact with the electrodes so as to enhance conductivity between the LED devices and the electrodes and reduce a resistance value, thereby greatly improving light extraction efficiency of the LED devices.

First, operation 1 includes manufacturing a nano-scale LED electrode assembly by self-aligning nano-scale LED devices on an electrode line including first and second electrodes which are formed on a base substrate to be spaced apart from each other. Preferably, operation 1 may include 1-1) injecting a dispersion solution, which includes a dispersion solvent and nano-scale LED devices, toward the electrode line including the first and second electrodes formed on the base substrate to be spaced apart from each other, and 1-2) manufacturing the nano-scale LED electrode assembly in which the first and second electrodes are connected by applying a power source to the electrode line to self-align the nano-scale LED devices.

First, a method of forming an electrode line on a base substrate will be described. Specifically, FIGS. 1A through 1F are perspective view showing processes of a method of manufacturing an electrode line formed on a base substrate according to one preferred embodiment of the present invention. However, a process of manufacturing an electrode line for nano-scale LED devices is not limited to manufacturing processes as will be described below.

First, as shown in FIG. 1A, one selected from the group consisting of a glass substrate, a crystal substrate, a sapphire substrate, a plastic substrate, and a flexible polymer film may be preferably used as the base substrate 100 on which the electrode line is formed. More preferably, the base substrate 100 may be transparent. However, types of the base substrate 100 are not limited, and may be used without limitation as long as the base substrate 100 is a general base substrate on which electrodes may be formed.

An area of the base substrate 100 is not limited, and may vary depending on the area of the first electrode to be formed on the base substrate 100, the area of the second electrode, the size of the nano-scale LED devices connected to the first and second electrodes, and the number of the nano-scale LED devices connected to the first and second electrodes. Preferably, the base substrate 100 may have a thickness of 100 μm to 1 mm, but the present invention is not limited thereto.

Next, as shown in FIG. 1B, the base substrate 100 may be coated with a photoresist (PR) to form a photoresist layer 101. The photoresist may be a photoresist generally used in the related art. A method of applying the photoresist onto the base substrate 100 to form the photoresist layer 101 may include one selected from the group consisting of spin coating, spray coating, and screen printing, preferably spin coating, but the present invention is not limited thereto. Specific methods may be performed using methods known in the related art. The photoresist layer 101 may have a thickness of 0.1 to 10 μm. However, the thickness of photoresist layer 101 may vary in consideration of the thickness of electrodes to be deposited onto the base substrate 100 later.

As such, after the photoresist layer 101 is formed on the base substrate 100, a mask 102 having patterns 102a and 102b engraved therein to correspond to the electrode line (see FIG. 3) in which the first and second electrodes on the same plane are interdigitatedly disposed to be spaced apart from each other may be put on the photoresist layer 101, as shown in FIG. 1C, and a top surface of the mask 102 may be irradiated with ultraviolet rays.

Then, an operation of immersing the photoresist layer 101 in a conventional photoresist solvent to remove an exposed portion of the photoresist layer 101 may be performed. In this way, the exposed portion of the photoresist layer on which the electrode line is to be formed as shown in FIG. 1D may be removed. The pattern 102a corresponding to a first electrode line belonging to the electrode line may have a width of 100 nm to 50 μm, and the pattern 102b corresponding to a second electrode line may have a width of 100 nm to 50 μm, but the present invention is not limited thereto.

Subsequently, as shown in FIG. 1E, an electrode-forming material 103 may be deposited onto a region from which the photoresist layer is removed in the form of an electrode line mask. The electrode-forming material 103 is a material used to form an electrode line including a first electrode and a second electrode formed to be spaced apart from the first electrode. In the case, the first electrode may be formed of one or more metal materials selected from the group consisting of aluminum, titanium, indium, gold, and silver, or one or more transparent materials selected from the group consisting of indium tin oxide (ITO), ZnO:Al, and a CNT-conductive polymer complex. When the electrode-forming material includes two or more materials, the first electrode may preferably have a structure in which the two or more materials are stacked. More preferably, the first electrode may be an electrode in which two materials such as titanium and gold are stacked. However, the first electrode is not limited to the description provided herein.

When the second electrode is formed of the electrode-forming material 103, the second electrode may be formed of one or more metal materials selected from the group consisting of aluminum, titanium, indium, gold, and silver, or one or more transparent materials selected from the group consisting of ITO, ZnO:Al, and a CNT-conductive polymer complex. When the electrode-forming material 103 includes two or more materials, the second electrode may preferably have a structure in which the two or more materials are stacked. More preferably, the second electrode may be an electrode in which two materials such as titanium and gold are stacked. However, the second electrode is not limited to the description provided herein.

The materials used to form the first electrode and the second electrode may be the same or different.

The deposition of the electrode-forming material may be performed using any one method such as a thermal deposition method, an e-beam deposition method, a sputtering deposition method, and a screen printing method, preferably a thermal deposition method, but the present invention is not limited thereto.

After the electrode-forming material is deposited to form the electrode line including a first electrode and a second electrode formed to be spaced apart from the first electrode, as shown in FIG. 1F, when the photoresist layer applied onto the base substrate 100 is removed using one photoresist stripper selected from acetone, 1-methyl-2-pyrrolidone (NMP), and dimethyl sulfoxide (DMSO), the electrode line 110 including a first electrode 110a deposited on the base substrate 100 and a second electrode 110b formed to be spaced apart from the first electrode 110a may be manufactured.

In the electrode line 110 of the present invention manufactured by the above-described method, an area of a unit electrode, that is, an area of an arrangement region in which two electrodes capable of arranging and independently driving the nano-scale LED devices are disposed may be preferably in a range of 1 $\mu m^2$ to 100 $cm^2$, more preferably in a range of 10 $\mu m^2$ to 100 $mm^2$. However, the area of the unit electrode is not limited to the above described areas. Also, the electrode line 110 may one electrode or a plurality of unit electrodes.

In addition, the spacing between the first electrode 110a and the second electrode 110b in the electrode line 110 may be less than or equal to a height of the nano-scale LED devices. Therefore, the nano-scale LED devices are sandwiched between or connected across the first electrode 110a and the second electrode 110b in a state in which the nano-scale LED devices lie flat between the two electrodes.

Meanwhile, the electrode line 110 applicable to the present invention may be applied as long as a nano-scale LED can be mounted as the second electrode 110b and the first electrode 110a are on the same plane as will be described below and formed to be spaced apart from the first electrode 110a. In this case, a specific configuration of the first electrode 110a and the second electrode 110b spaced apart on the same plane may vary according to purpose.

Next, FIG. 2 is a perspective view of an electrode line including first and second electrodes formed on a base substrate according to one preferred embodiment of the present invention. Here, first electrodes 110a and 110a' and/or second electrodes 110b and 110b' may be formed on a base substrate 100. The term "on the base substrate" may mean a state in which at least one of the first electrodes 110a and 110a' and second electrodes 110b and 110b' may be directly formed on a surface of the base substrate 100 or may be formed to be spaced apart from a top surface of the base substrate 100.

More specifically, as shown in FIG. 2, in a state in which all of the first electrodes 110a and 110a' and the second electrodes 110b and 110b' are directly formed on a surface of the base substrate 100, the first electrode 110a' and the second electrode 110b' may be interdigitatedly disposed to be spaced apart from each other and the first electrode 110a' and the second electrode 110b' are on the same plane.

FIG. 3 is a plan view of the electrode line including the first and second electrodes formed on the base substrate according to one preferred embodiment of the present invention. Here, in a state in which all of first electrodes 110a and 110c and second electrodes 110b and 110d are directly formed on a surface of the base substrate 100, the first electrode 110c and the second electrode 110d may be spirally disposed spaced apart on the same plane.

As such, when the electrode lines are configured to be interdigitatedly or spirally disposed, the nano-scale LED devices included on the base substrate 100 having a limited area may be arranged once to increase a drive area of a unit electrode that is independently operable, thereby increasing the number of nano-scale LED devices mounted on the unit electrode. Thus, since the intensity of light emitted from the LEDs per unit area increases, the LEDs may utilized in various photoelectric devices that require higher brightness per unit area.

Meanwhile, FIGS. 2 and 3 are preferred embodiments, but the present invention is not limited thereto. For example, two electrodes may be realized by being widely modified to have all possible structures in which the two electrodes are spaced at a predetermined distance from each other.

Also, unlike the electrode line according to one preferred embodiment of the present invention as shown in FIG. 2, according to another embodiment of the present invention, the second electrode may be formed to be spaced apart from an upper portion of the base substrate.

Figure 4:
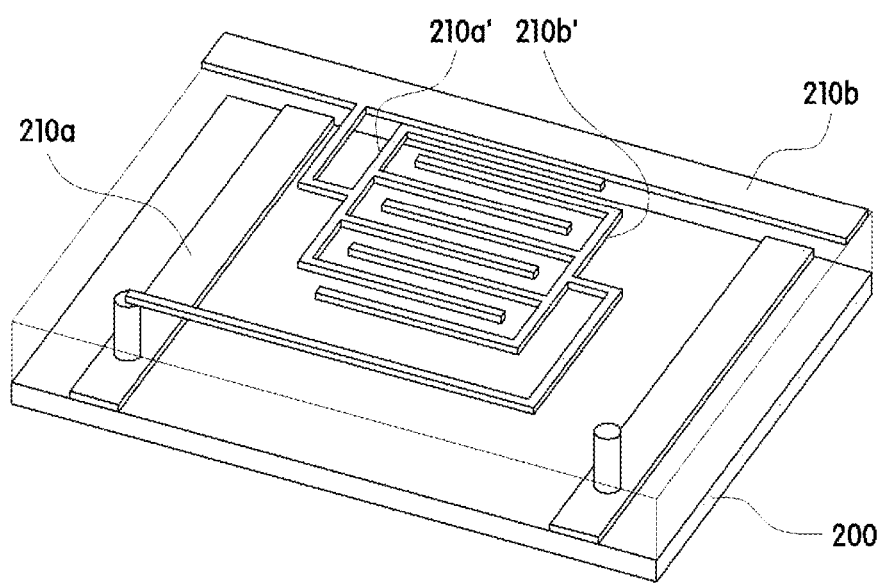
FIG. 4 is a perspective view of an electrode line including first and second electrodes formed on a base substrate according to one preferred embodiment of the present invention.

Specifically, FIG. 4 is a perspective view of an electrode line including first and second electrodes formed on a base substrate according to one preferred embodiment of the present invention. Here, first electrodes 210a and 210a' may be directly formed on a surface of a base substrate 200, or second electrodes 210b and 210b' may be formed to be spaced apart from an upper portion of the base substrate 200. In this case, the first electrode 210a' and the second electrode 210b' may be interdigitatedly disposed to be spaced apart on the same plane.

Hereinafter, a configuration in which first and second electrodes are interdigitatedly disposed on the same plane will be mainly described. However, the first and second electrodes may be directly formed on a surface of a base substrate, or may be formed to be spaced apart from a surface of the base substrate. In this case, the first and second electrodes may not be on the same plane.

Next, a dispersion solution including a plurality of nano-scale LED devices, which is injected toward an electrode line, will be described. The dispersion solution may be prepared by mixing a plurality of nano-scale LED devices and a dispersion solvent. The dispersion solvent may be in an ink or paste phase. Preferably, the dispersion solvent may include one or more selected from the group consisting of acetone, water, alcohol, and toluene, more preferably acetone. However, types of the dispersion solvent are not limited to the above described solvents, and may be used without limitation as long as they are solvents that may be easily volatilized without exerting physical and chemical effects on the nano-scale LED devices.

Preferably, the nano-scale LED devices may be included at a content of 0.001 to 100 parts by weight, based on 100 parts by weight of the dispersion solvent. When the nano-scale LED devices are included at a content of less than 0.001 parts by weight, the number of the nano-scale LED devices connected to the electrodes may be reduced, which makes it difficult to exert normal functions of the nano-scale LED electrode assembly. To solve the problems, the dispersion solution may be added dropwise several times. When the content of the nano-scale LED devices is greater than 100 parts by weight, an arrangement between the plurality of nano-scale LED devices may be disturbed.

The nano-scale LED devices may be used without limitation as long as they are nano-scale LED devices generally used for lightings or displays. Preferably, the nano-scale LED devices may have a height of 100 nm to 10 µm, more preferably a height of 500 nm to 5 µm. When the height of the nano-scale LED devices is less than 100 nm, it is difficult to manufacture high-efficiency LED devices. On the other hand, when the height of the nano-scale LED devices is greater than 10 µm, light emitting efficiency of the LED devices may be degraded. The nano-scale LED devices may have various shapes such as a cylindrical shape, a rectangular parallelepiped shape, etc., preferably a cylindrical shape, but the shape of the nano-scale LED devices is not limited to the above described shapes.

Meanwhile, the nano-scale LED devices according to preferred embodiments of the present invention are disclosed in Korean Patent Application No. 2011-0040174 filed by the present inventors, the disclosure of which is incorporated herein by reference in its entirety.

Hereinafter, in the description of the nano-scale LED devices, the terms "above," "below," "on," "under," "upper", and "lower" refer to vertical upper and lower directions with respect to each of layers included in the nano-scale LED devices.

Each of the nano-scale LED devices may include a first electrode layer, a first conductive semiconductor layer formed on the first electrode layer, an active layer formed on the first conductive semiconductor layer, a second conductive semiconductor layer formed on the active layer, and a second electrode layer formed on the second conductive semiconductor layer.

Figure 5:
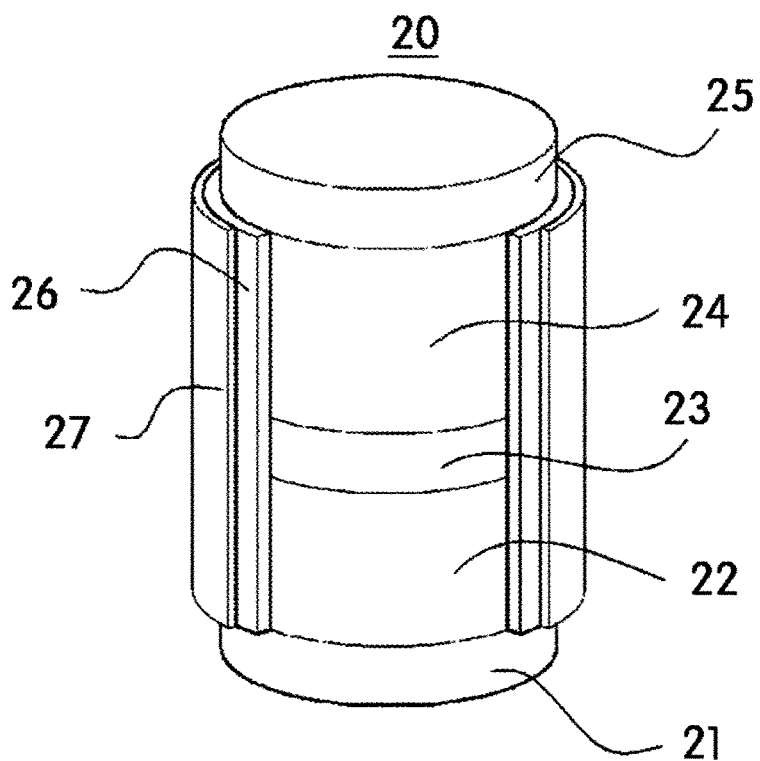
FIG. 5 is a perspective view of a nano-scale LED device according to one preferred embodiment of the present invention.

Specifically, FIG. 5 is a perspective view showing one exemplary embodiment of a nano-scale LED device included in the present invention. Here, a nano-scale LED device 20 includes a first electrode layer 21, a first conductive semiconductor layer 22 formed on the first electrode layer 21, an active layer 23 formed on the first conductive semiconductor layer 22, a second conductive semiconductor layer 24 formed on the active layer 23, and a second electrode layer 25 formed on the second conductive semiconductor layer 24.

First, the first electrode layer 21 will be described.

The first electrode layer 21 may be formed of a metal or a metal oxide used for electrodes of conventional LED devices. Preferably, chromium (Cr), titanium (Ti), aluminum (Al), gold (Au), nickel (Ni), ITO, and an oxide or alloy thereof may be used alone or in combination thereof, but the present invention is not limited thereto. Preferably, the first electrode layer 21 may have a thickness of 1 to 100 nm, but the present invention is not limited thereto.

Next, the first conductive semiconductor layer 22 formed on the first electrode layer 21 will be described. The first conductive semiconductor layer 22 may, for example, include an n-type semiconductor layer. When the nano-scale LED device 20 is a blue light emitting device, the n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), for example, one or more selected from the group consisting of InAlGaN, GaN, AlGaN, InGaN, AlN, InN, etc. Also, the first conductive semiconductor layer may be doped with a first conductive dopant (e.g., Si, Ge, Sn, etc.). Preferably, the first conductive semiconductor layer 22 may have a thickness of 500 nm to 5 µm, but the present invention is not limited thereto. The color of light emitted from the nano-scale LED device 20 is not limited to a blue color. When the colors of the emitted light are different, different types of Group III-V semiconductor materials may be used for the n-type semiconductor layer without limitation.

Next, the active layer 23 formed on the first conductive semiconductor layer 22 will be described. When the nano-scale LED device 20 is a blue light emitting device, the active layer 23 may be disposed on the first conductive semiconductor layer 22, and may be formed in a single quantum well (SQW) or multiple quantum well (MQW) structure. A cladding layer (not shown) doped with a conductive dopant may be formed on and/or under the active layer 23. In this case, the cladding layer doped with the conductive dopant may be realized as an AlGaN layer or an InAlGaN layer. In addition, materials such as AlGaN, AlInGaN, and the like may be used for the active layer 23. When an electric field is applied to the active layer 23, light may be generated due to coupling of electron-hole pairs. Preferably, the active layer 23 may have a thickness of 10 nm to 200 nm, but the present invention is not limited thereto. The active layer 23 may be disposed at various positions according to the types of the nano-scale LED device 20.

The light color of the nano-scale LED is not limited to the blue color. When the light color is different, different types of Group III-V semiconductor materials may be used for the active layer. The color of light emitted from the nano-scale LED device 20 is not limited to a blue color. When the colors of the emitted light are different, different types of Group III-V semiconductor materials may be used for the active layer 23 without limitation.

Next, the second conductive semiconductor layer 24 formed on the active layer 23 will be described. When the nano-scale LED device 20 is a blue light emitting device, the second conductive semiconductor layer 24 may be formed on the active layer 23. In this case, the second conductive semiconductor layer 24 may be realized as at least one p-type semiconductor layer. Here, the p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), for example, one or more selected from the group consisting of InAlGaN, GaN, AlGaN, InGaN, AlN, InN, etc. Also, the second conductive semiconductor layer 24 may be doped with a second conductive type dopant (e.g., Mg). Here, a light emitting structure may include the first conductive semiconductor layer 22, the active layer 23, and the second conductive semiconductor layer 24 as minimum components. Also, the light emitting structure may further include a phosphor layer, an active layer, a semiconductor layer, and/or an electrode layer formed on/under each layer. Preferably, the second conductive semiconductor layer 24 may have a thickness of 50 nm to 500 nm, but the present invention is not limited thereto. The color of light emitted from the nano-scale LED device 20 is not limited to a blue color. When the colors of the emitted light are different, different types of Group III-V semiconductor materials may be used for the p-type semiconductor layer without limitation.

Then, the second electrode layer 25 formed on the second conductive semiconductor layer 24 will be described.

The second electrode layer 25 may be formed of a metal or a metal oxide used for electrodes of conventional LED devices. Preferably, chromium (Cr), titanium (Ti), aluminum (Al), gold (Au), nickel (Ni), ITO, and an oxide or alloy thereof may be used alone or in combination thereof, but the present invention is not limited thereto. Preferably, the second electrode layer 25 may have a thickness of 1 to 100 nm, but the present invention is not limited thereto.

Meanwhile, the nano-scale LED device 20 included in the nano-scale LED electrode assembly according to the present invention may further include an insulating coating film 26 with which an outer surface of the nano-scale LED device 20 is coated.

Specifically, referring to FIG. 5, the insulating coating film 26 may be applied to cover the entire outer surface of the active layer 23. Preferably, the insulating coating film 26 may be applied onto an outer surface of one of the first conductive semiconductor layer 22 and the second conductive semiconductor layer 24 to prevent the durability of the nano-scale LED device from being deteriorated due to damage to the outer surface of the semiconductor layer.

The insulating coating film 26 may prevent an electrical short circuit from occurring when the active layer of the nano-scale LED device 20 comes in contact with the electrode line included in the nano-scale LED electrode assembly. Also, the insulating coating film 26 may protect the entire outer surface of the active layer 23 of the nano-scale LED device 20 to prevent surface defects of the active layer 23, thereby preventing light emitting efficiency from being deteriorated.

When the separate nano-scale LED devices are disposed one by one between two different electrodes to be connected with each other, an electrical short circuit occurring due to the contact between the active layer and the electrodes may be prevented. However, it is difficult to physically mount the nano-scale LED devices having a nano-scale size one by one on the electrodes. Therefore, in the present invention, the electrodes may be mounted by applying a first power source to the electrode line in operation 2, as will be described below, to self-align the nano-scale LED devices between the two different electrodes. In this case, the nano-scale LED devices may be changed in position through movement and alignment between the two different electrodes. In this process, an electrical short circuit may be frequently caused since the active layer of the nano-scale LED device may come in contact with the electrode line.

Meanwhile, when the nano-scale LED device is stood upright on the electrode, an electrical short-circuit problem occurring due to the contact between the active layer and the electrode line may be prevented. That is, when the nano-scale LED device is not stood upright on the electrode but is laid flat on the electrode, the active layer may come in contact with the electrode line. In this case, the nano-scale LED device may not be connected to the two different electrodes, but no electrical short-circuit problem may occur.

Figure 6:
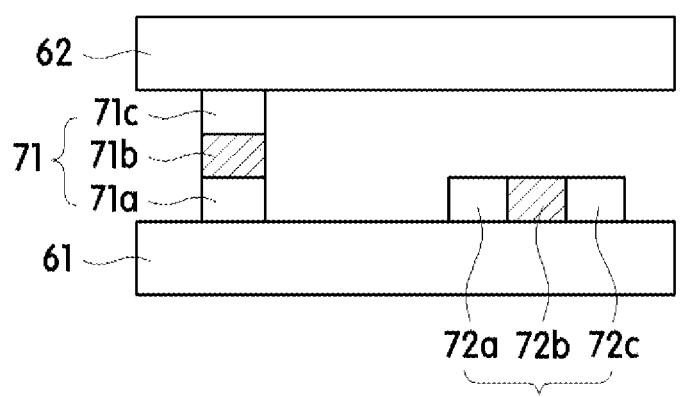
FIG. 6 is a vertical cross-sectional view of a conventional nano-scale LED electrode assembly.

Specifically, FIG. 6 is a vertical cross-sectional view of a conventional nano-scale electrode assembly. Here, it can be seen that a first semiconductor layer 71a of a first nano-scale LED device 71 is connected to a first electrode line 61, a second semiconductor layer 71c is connected to a second electrode line 62, and the first nano-scale LED device 71 is stood upright to be connected to two electrodes 61 and 62 positioned in a vertical direction. When the nano-scale LED device 71 is connected to the two electrodes in the electrode assembly as shown in FIG. 6, an active layer 71b of the device is not be likely to come in contact with one of the two different electrodes 61 and 62, thereby preventing an electrical short circuit from occurring due to the contact between the active layer 71b and the two electrodes 61 and 62.

On the other hand, a second nano-scale LED device 72 may be laid flat on the first electrode 61 as shown in FIG. 6. In this case, an active layer 72b of the second nano-scale LED device 72 may come in contact with the first electrode 61. Here, problems in the connection between the second nano-scale LED device and the first and second electrodes 61 and 62 rather than the electrical short circuit may occur. Therefore, when outer circumferential surfaces of the first semiconductor layer 71a, the active layer 71b and the second semiconductor layer 71c of the first nano-scale LED device are coated with an insulating coating film, the insulating coating film may have only a purpose and effect of reducing light emitting efficiency by preventing the outer surface of the nano-scale LED device from being damaged.

However, unlike the conventional nano-scale electrode assembly as shown in FIG. 6, according to the present invention, the two different electrodes may be disposed to be spaced apart on the same plane (see FIG. 2). Also, since the nano-scale LED device is laid flat to be connected with the two electrodes in a state in which the nano-scale LED device is parallel to the same plane on which the two electrodes are formed, an electrical short-circuit problem which does not occur in the conventional nano-scale electrode assembly when the active layer of the nano-scale LED device comes in contact with the electrodes may inevitably occur. Therefore, to prevent the electrical short-circuit problem, it is desirable to provide an insulating coating film which is applied to cover the entire outer surface of the active layer of the nano-scale LED device.

In addition, like the nano-scale LED device included in the nano-scale LED electrode assembly according to the present invention, the active layer may be inevitably exposed to the outside in the nano-scale LED device having a structure in which the first semiconductor layer, the active layer, the second semiconductor layer are sequentially arranged in a vertical direction. Also, in the LED device having such a structure, the active layer may not only be disposed at the center of the device in a longitudinal direction, but also may be biased toward a certain semiconductor layer, thereby increasing the possibility of contact between the electrode and the active layer. Therefore, an insulating coating film which is applied to cover the entire outer surface of the active layer may be preferably provided to achieve the purpose of the present invention. As a result, the insulation film may be necessary.

Figure 7:
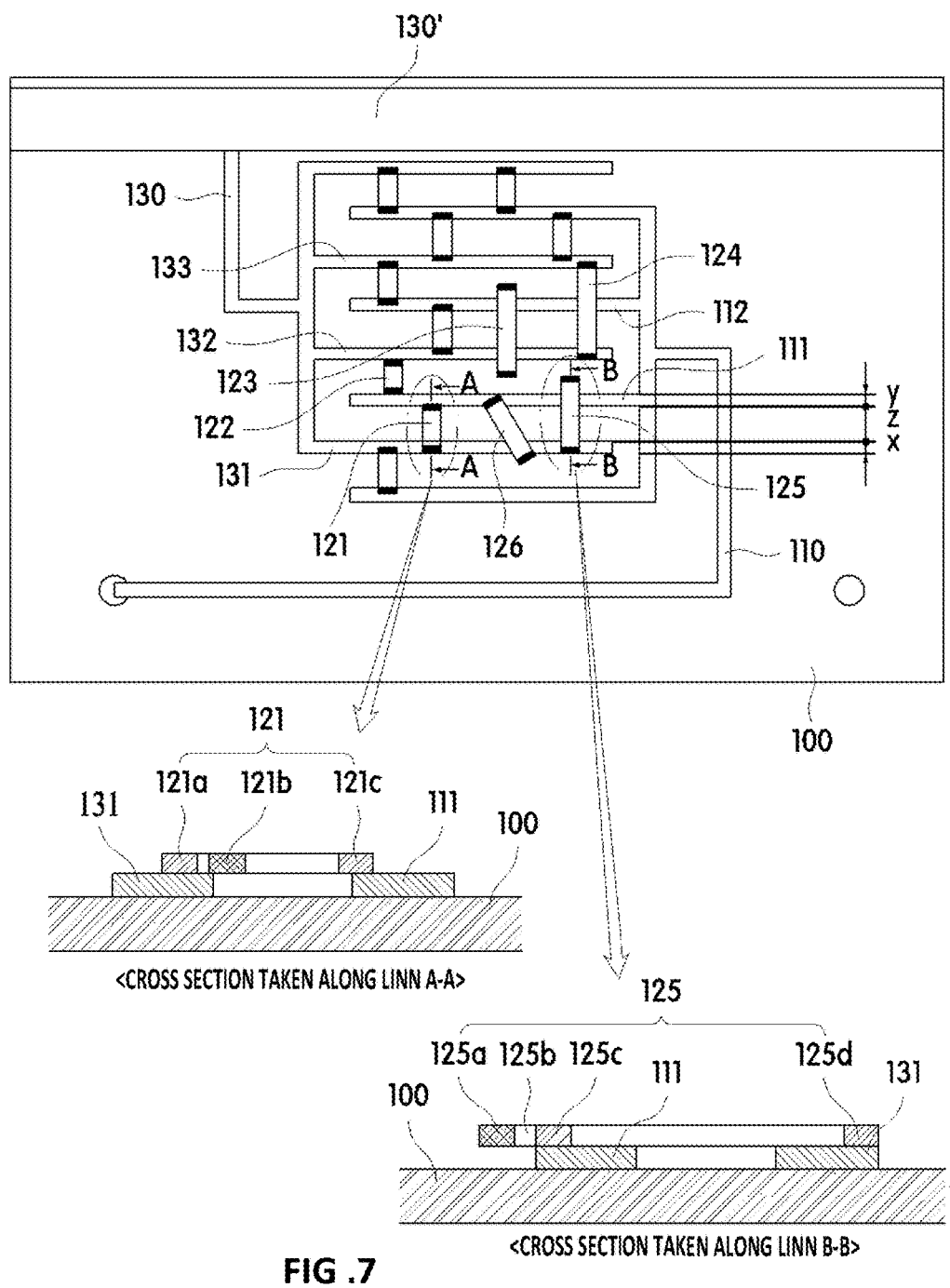
FIG. 7 shows a plan view and a vertical cross-sectional view of a nano-scale LED device connected with the first and second electrodes according to one preferred embodiment of the present invention.

Specifically, FIG. 7 shows a plan view and a vertical cross-sectional view of a nano-scale LED device connected to the first and second electrodes according to one preferred embodiment of the present invention. Specifically, as shown in a cross section taken along line A-A in FIG. 7, an active layer 121b of nano-scale LED devices 121 is not disposed at a central portion of the nano-scale LED device 121, but may be disposed to be biased toward a left side thereof. In this case, a portion of the active layer 121b may be very likely to be connected to an electrode 111, causing an electrical short circuit, which may cause defects in the nano-scale LED electrode assembly. To solve the above problems, the nano-scale LED device provided in the present invention may be coated with an insulating coating film to cover the entire outer surface of the active layer. As a result, even when the active layer 121b is disposed across the electrode, like the first nano-scale LED device 121 shown in FIG. 7, an electrical short circuit may be prevented due to the insulating coating film.

As described above, referring to FIG. 6, the insulating coating film 26 may preferably include one or more selected from the group consisting of silicon nitride ($Si_3N_4$), silicon dioxide ($SiO_2$), aluminum oxide ($Al_2O_3$), hafnium oxide ($HfO_2$), yttrium oxide ($Y_2O_3$), and titanium dioxide ($TiO_2$). More preferably, the insulating coating film 26 may be formed of the above described substances, or may be transparent, but the present invention is not limited thereto. When the insulating coating film 26 is transparent, the insulating coating film 26 may play its original role, and simultaneously minimize a reduction in light emitting efficiency that may rarely occur through coating with the insulating coating film 26.

Meanwhile, according to one preferred embodiment of the present invention, an outer surface of one of the first electrode layer 21 and the second electrode layer 25 of the nano-scale LED device may not be coated with the insulating coating film 26. More preferably, both the two electrode layers 11 and 12 may not be coated with the insulating coating film 26.

In this case, the two electrode layers 21 and 25 have to be electrically connected to other electrodes. However, when the two electrode layers 21 and 25 are coated with the insulating coating film 26, the electrical connection may be disturbed. As a result, light emitted from the nano-scale LED device may be reduced, or no light may be emitted from the nano-scale LED device since the nano-scale LED device is not electrically connected to the electrode. However, since there are no problems when two electrode layers 21 and 25 are electrically connected to the different electrodes, the insulating coating film 26 may be included in the remaining region of the electrode layers after excluding the end portions of the two electrode layers 21 and 25.

Also, according to one preferred embodiment of the present invention, the nano-scale LED device 20 may further include a hydrophobic film 27 formed on the insulating coating film 26. The hydrophobic film 27 may give a hydrophobic property to a surface of the nano-scale LED device 20 so as to prevent aggregation between the LED devices. When the nano-scale LED devices 20 are mixed with a dispersion solvent, the aggregation between the nano-scale LED devices may be minimized to prevent characteristics of the separate nano-scale LED devices from being degraded. Also, when a power source is applied to the electrode line, the nano-scale LED devices 20 may be more easily aligned in predetermined positions.

The hydrophobic film 27 may be formed on the insulating coating film 26. In this case, types of the hydrophobic film 27 that may be used herein may be used without limitation as long as they can be formed on the insulating coating film 26 to prevent the nano-scale LED devices from being aggregated. Preferably, the hydrophobic film 27 may be formed of at least one selected from the group consisting of self-assembled monolayers (SAMs) such as octadecyl-trichlorosilane, (OTS), fluoroalkyltrichlorosilane, and perfluoroalkyltriethoxy-silane, and fluoropolymers such as Teflon and Cytop, which may be used alone or in a combination thereto, but the present invention is not limited thereto.

Meanwhile, the height of the nano-scale LED device included in the nano-scale LED electrode assembly according to the present invention may satisfy the following Relation 1 to realize an electrical connection between the nano-scale LED device and the two different electrodes. When the nano-scale LED device is not electrically connected to the two electrodes, the nano-scale LED device having no electrical connection with the two electrodes does not emit light even when a power source is applied to the electrode line, which makes it impossible to achieve the objects of the present invention.

Relation 1 is expressed as follows:

$$0.5Z \leq H < X+Y+2Z \quad \text{[Relation 1]}$$

Preferably, Relation 1 may satisfy $Z \leq H < X+Y+2Z$, more preferably $Z \leq H \leq X+Y+Z$ (wherein 100 nm<X≤10 μm, 100 nm<Y≤10 μm, and 100 nm<Z≤10 μm). The symbol 'X' represents a width of the first electrode included in the electrode line, the symbol 'Y' represents a width of the second electrode, the symbol 'Z' represents a distance between a first electrode and a second electrode adjacent to the first electrode, and the symbol 'H' represents a height of the nano-scale LED device. Here, when the first and second electrodes are provided in a plural number, the distance Z between the two electrodes may be the same or different.

A portion of the nano-scale LED device which is electrically connected with the two different electrodes may be at least one layer (or one of the second conductive semiconductor layer and the second electrode layer) of the first electrode layer and the first conductive semiconductor layer of the nano-scale LED device.

When the height of the nano-scale LED device is significantly smaller than the distance between the two different electrodes, it may be difficult for the nano-scale LED device to be connected with both of the two electrodes. Therefore, the nano-scale LED device may be a nano-scale LED device having a height satisfying a requirement of 0.5Z≤H in Relation 1. When the height of the nano-scale LED device does not satisfy the requirement of 0.5Z≤H in Relation 1, the nano-scale LED device may not be electrically connected with the first and second electrodes, but may be electrically connected with only one of the first and second electrodes. More preferably, as shown in FIG. 7, since a second nano-scale LED device 122 may be sandwiched between the first electrode 111 and the second electrode 132 to be electrically connected therewith, the nano-scale LED device provided in the present invention may be an LED device that satisfies a requirement of Z≤H in Relation 1.

Meanwhile, when the height H of the nano-scale LED device is increased in consideration of the width X of the first electrode, the width Y of the second electrode, and the electrode distance Z between the first and second electrodes, a portion of a nano-scale LED device 123 of FIG. 7 (excluding both ends thereof) may be independently connected to a first electrode 112 and a second electrode 132. When the active layer of the nano-scale LED device 123 is connected as described above, an electrical short circuit between the electrode and the nano-scale LED device 123 may be caused when the nano-scale LED device is not coated with the insulating coating film. However, in the nano-scale LED device according to the present invention, since the insulating coating film is coated to cover the entire outer surface of the active layer. Thus, like the nano-scale LED device 123 as shown in FIG. 7, even when the portion of the nano-scale LED device excluding both ends thereof is connected with the electrodes, the nano-scale LED device may be electrically connected to the electrodes without causing an electrical short circuit.

However, since the height H of the nano-scale LED device is increased in consideration of the width X of the first electrode, the width Y of the second electrode, and the electrode distance Z between the first and second electrodes, the nano-scale LED device that is not electrically connected to the electrodes may be included in the nano-scale LED electrode assembly when the height H of the nano-scale LED device does not satisfy a requirement of H<X+Y+2Z. Specifically, a nano-scale LED device 124 may be electrically connected to one first electrode 112 and two second electrodes 132 and 133 at the same time, as shown in FIG. 7. Here, the height of the nano-scale LED device satisfying such a case may not satisfy a requirement of H<X+Y+2Z in Relation 1. In this case, since the active layer is coated with the insulating coating film in the nano-scale LED device according to the present invention, a problem regarding an electrical short circuit caused due to the contact of the nano-scale LED device with the first electrode 112 may be solved, but the nano-scale LED device is not substantially electrically connected as both ends of the nano-scale LED device 124 are connected with the two second electrodes 132 and 133. As a result, such a nano-scale LED device 124 may have a problem in that no light is emitted even when a power source is applied to the electrode line. Therefore, the height H of the nano-scale LED device should satisfy the requirement of H<X+Y+2Z in Relation 1. However, when the active layer of the nano-scale LED device is biased toward a certain conductive semiconductor layer 125b (see FIG. 7), and a portion of the nano-scale LED device connected with the electrode is not the electrode layer and/or the conductive semiconductor layer but the active layer coated with the insulating coating film, an electrical short circuit does not occur due to insulating coating film, but the nano-scale LED device may not be electrically connected with the electrode line. Specifically, as shown in FIG. 7, a nano-scale LED device 125 may be connected to the first electrode 111 and the second electrode 131 at the same time. However, referring to the cross section taken along line B-B in FIG. 7, it is seen that a portion of the nano-scale LED device connected with the first electrode 111 is a portion of an active layer 125c coated with the insulating coating film, and a first electrode layer 125a and the first conductive semiconductor layer 125b are not connected to the first electrode 111. In this case, since a portion of the active layer 125c in the nano-scale LED device is coated with the insulating coating film, an electrical short circuit does not occur, but the first electrode layer 125a and the first conductive semiconductor layer 125b may not be connected to the first electrode 111. Therefore, the nano-scale LED device 125 may not emit light when a power source is applied to the electrode line. In cases that may happen in such circumstances, as the height H of the nano-scale LED device may satisfy a requirement of X+Y+Z<H<X+Y+2Z in Relation 1, the height H of the nano-scale LED device may more preferably satisfy a requirement of X+Y+Z in Relation 1. In this case, the nano-scale LED device has an advantage in that the nano-scale LED electrode assembly electrically connected without causing an electrical short circuit regardless of the position of the active layer coated with the insulating coating film in a longitudinal direction may be realized.

Meanwhile, the nano-scale LED device may further include an insulating barrier formed on the base substrate in operation 1 to surround a region of the electrode line on which a plurality of nano-scale LED devices are disposed. When the insulating barrier is formed on the base substrate, a dispersion solution including the plurality of nano-scale LED devices may be provided in the region of the electrode line surrounded by the insulating barrier. The insulating barrier may serve to dispose the nano-scale LED devices in a desired region of the electrode line by preventing the dispersion solution including the nano-scale LED devices from spreading to a region other than the region of the electrode line in which the nano-scale LED devices are to be provided when the dispersion solution including the nano-scale LED devices is applied to the electrode line.

The insulating barrier may be manufactured by a manufacturing process as will be described below, but a method of manufacturing the insulating barrier is not limited thereto.

Specifically, FIGS. 8A through 8F are schematic diagram showing manufacturing processes for forming an insulating barrier on a base substrate and an electrode line formed on the base substrate according to one preferred embodiment of the present invention. As described above, after the electrode line deposited onto the base substrate is manufactured, the insulating barrier may be manufactured.

First, as shown in FIG. 8A, a base substrate 100 having an electrode line 110 formed on one surface thereof is manufactured. Here, the electrode line 110 includes a first electrode 110a, and a second electrode 110b formed to be spaced apart from the first electrode 110a. Next, as shown in FIG. 8B, an insulation layer 104 may be formed on the base substrate 100 and the electrode line 110 including the first and second electrodes 110a and 110b formed on the base substrate 100. The insulation layer 104 may be a layer for forming the insulating barrier after undergoing a process as will be described below. In this case, the insulation layer 104 may be formed of an insulating material generally used in the related art, preferably, one or more selected from the group consisting of inorganic insulating materials such as silicon dioxide ($SiO_2$), silicon nitride ($Si_3N_4$), aluminum oxide ($Al_2O_3$), hafnium oxide ($HfO_2$), yttrium oxide ($Y_2O_3$) and titanium dioxide ($TiO_2$), and various transparent polymeric insulating materials. When the base substrate 100 and the electrode lines 103a and 103b formed on the base substrate 100 are coated with an inorganic insulation layer, the insulation layer 104 may be formed using a method selected from the group consisting of a chemical vapor deposition method, an atomic layer deposition method, an e-beam deposition method, and a spin coating method, preferably a chemical vapor deposition method, but the present invention is not limited thereto. Also, a method for applying the polymeric insulation layer may be performed using a method selected from the group consisting of spin coating, spray coating, and screen printing, preferably a spin coating method, but the present invention is not limited thereto. A specific coating method may be performed with methods known in the related art. The coated insulation layer 104 may have a thickness such that the nano-scale LED device does not spread over the region of the electrode line in which the nano-scale LED device is to be provided and the thickness of the insulation layer 104 does not have an effect on subsequent processes. Thus, the thickness of the insulation layer 104 may be preferably in a range of 0.1 to 100 μm, more preferably in a range of 0.3 to 10 μm.

Next, a photoresist layer 105 may be formed by coating the insulation layer 104 with a photoresist (PR). The photoresist may be a photoresist widely used in the related art. A method for coating the insulation layer 104 with the photoresist may include one method selected from the group consisting of spin coating, spray coating, and screen printing, preferably spin coating, but the present invention is not limited thereto. Specific coating methods may be performed with methods known in the related art. Preferably, the thickness of the photoresist layer 105 to be applied is larger than the thickness of the insulation layer 104 applied through a mask used for an etching process. Therefore, the photoresist layer 105 may have a thickness of 1 μm to 20 μm. However, the thickness of the photoresist layer 105 to be applied may vary in consideration of a purpose thereof.

Subsequently, as shown in FIG. 8C, after the photoresist layer 105 is formed on the insulation layer 104, a mask 106 having a shape corresponding to a horizontal cross section of the insulating barrier may be put on the photoresist layer 105, and a top surface of the mask 106 may be exposed to UV rays.

Thereafter, an operation of immersing the exposed photoresist layer in a conventional photoresist solvent for removal thereof may be performed. In this way, as shown in FIG. 8D, a portion of the exposed photoresist layer corresponding to the region of the electrode line on which the nano-scale LED device is mounted may be removed.

Then, an operation of removing a portion of the exposed insulation layer by etching a portion of the insulation layer exposed through removal of the photoresist layer may be performed. The etching may be performed through wet etching or dry etching, preferably dry etching. A specific method for performing the etching process may be performed with methods known in the related art. The dry etching may be performed using one or more methods selected from the group consisting of plasma etching, sputter etching, reactive ion etching, and reactive ion beam etching. However, the specific etching method is not limited to the above-described methods. When the exposed insulation layer is removed through the etching, the base substrate 100 and electrode lines 110a' and 110b' may be exposed, as shown in FIG. 8E.

Next, as shown in FIG. 8F, when the photoresist 105 (see FIG. 8E) applied on the base substrate 100 is removed using one photoresist stripper selected from the group consisting of 1-methyl-2-pyrrolidone (NMP) and dimethyl sulfoxide (DMSO), an insulating barrier 104 may be formed on a region other than a region P (see FIG. 8E) on which the nano-scale LED device is substantially mounted on the base substrate 100.

In this way, when the insulating barrier 104 is formed on the base substrate 100, a dispersion solution including the plurality of nano-scale LED devices may be injected toward the region of the electrode line surrounded by the insulating barrier 104.

Figures 9A, 9B:
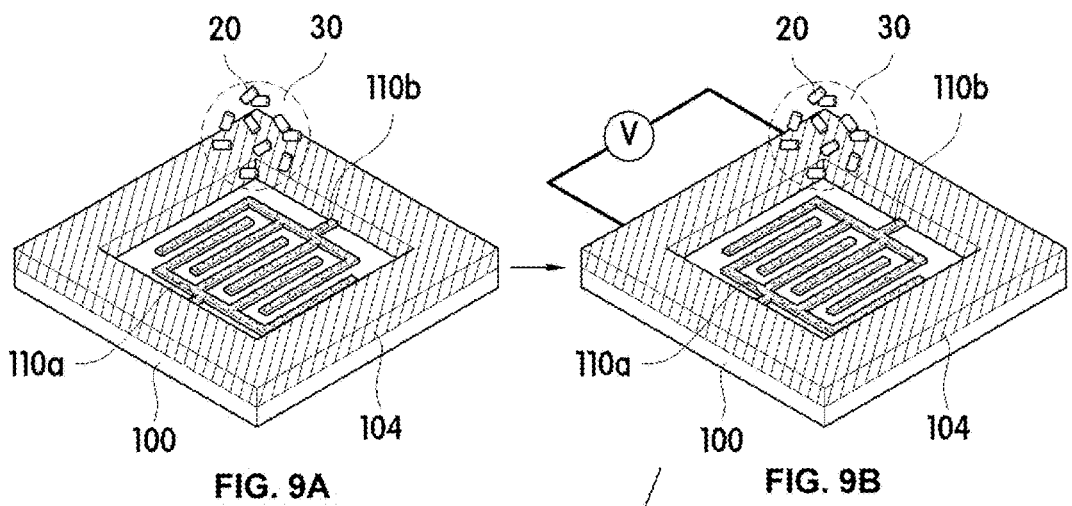
FIGS. 9A through 9C are perspective view showing processes of a method of manufacturing a nano-scale LED electrode assembly according to one preferred embodiment of the present invention.
Figure 9C:
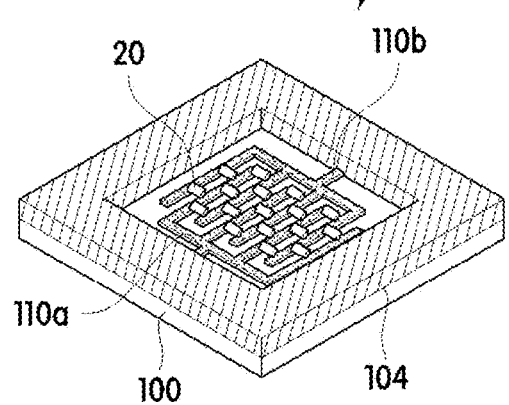

Specifically, FIGS. 9A through 9C are perspective view showing processes of a method of manufacturing a nano-scale LED electrode assembly according to one preferred embodiment of the present invention. As shown in FIG. 9A, a dispersion solution 30 including a plurality of nano-scale LED devices 20 may be injected toward a region of electrode lines 110a and 110b surrounded by the insulating barrier 104 formed on the base substrate 100. In this case, the dispersion solution 30 including the nano-scale LED devices 20 may be directly disposed in a desired region of the electrode line, compared to when the insulating barrier 104 is not formed on the base substrate 100. Also, after the dispersion solution 30 is injected, the nano-scale LED devices 20 in the dispersion solution 30 spread to the edges of the electrode line to prevent the nano-scale LED devices 20 from being disposed in a region of the electrode line on which the nano-scale LED devices 20 are not mounted and/or an electrode line-free region. After the dispersion solution 30 including the plurality of nano-scale LED devices 20 is injected, when a power source is applied to the electrode lines 110a and 110b as shown in FIG. 9B, the plurality of nano-scale LED devices 20 are self-aligned on the electrode lines 110a and 110b, as shown in FIG. 9C.

Next, the nano-scale LED electrode assembly to which the first electrode and the second electrode are connected is manufactured by applying a power source to the electrode line to self-align the nano-scale LED devices.

In general, since the LED devices have a size sufficient for direct and physical arrangement, the LED devices may be connected to both of the different electrodes formed spaced apart on the same plane. However, since the size of the nano-scale LED devices of the present invention is too small for direct and physical arrangement, it is difficult to connect the different nano-scale LED electrodes spaced apart on the same plane with each other. Also, since the nano-scale LED devices of the present invention may have a cylindrical shape, the nano-scale LED devices may move by rolling due to such a shape. As a result, even when the first electrode and the second electrode are disposed to be connected to each other, the relative positions of the first electrode and the second electrode may be easily changed.

To solve the above problems, in the present invention, since a first power source is applied to the electrode line to self-align the nano-scale LED devices, the first electrode and the second electrode may be connected, that is, electrically connected to each other.

The power source applied to the electrode line may be a variable power source having a predetermined amplitude and period, and may have pulse waves composed of waveforms such as sinusoidal waves, for example, sine waves, and waveforms other than the sinusoidal wave. For example, an AC power source may be applied to the first electrode, or a direct current (DC) power source may be repeatedly applied to the first electrode 1,000 times per second at a voltage of 0 V, 30 V, 0 V, 30 V, 0 V, and 30 V. Conversely, the DC power source may be repeatedly applied to the second electrode at a voltage of 30 V, 0 V, 30 V, 0 V, 30 V, and 0 V to generate a variable power source having a predetermined amplitude and period.

Preferably, the power source may have a voltage (amplitude) of 0.1 V to 1,000 V and a frequency of 10 Hz to 100 GHz. The self-aligned nano-scale LED devices may be included in a solvent, and then injected toward the electrode line. In this case, the solvent may be evaporated while dropping onto the electrodes. Also, since charges are asymmetrically induced to the nano-scale LED devices due to induction of an electric field generated by a potential difference between the two electrodes, both ends of the nano-scale LED devices may be self-aligned between the two facing different electrodes. Preferably, the nano-scale LED devices may be connected to the two different electrodes by applying a power source for 5 to 120 seconds.

Meanwhile, the number N of the nano-scale LED devices connected to the first electrode and the second electrode may depend on several variables that are adjustable herein. The variables may include a voltage V of the applied power source, a frequency F (Hz) of the power source, a concentration C (% by weight of the nano-scale LEDs) of the dispersion solution including the nano-scale LED devices, a distance Z between the two electrodes, and an aspect ratio AR of the nano-scale LEDs (wherein AR=H/D, and D represents a diameter of the nano-scale LED). As a result, the number N of the nano-scale LED devices connected to the first electrode and the second electrode may be proportional to the voltage V, the frequency F (Hz), the concentration C of the dispersion solution including the nano-scale LED devices, and the aspect ratio AR of the nano-scale LEDs, and inversely proportional to the distance Z between the two electrodes.

Thus, the nano-scale LED devices may be self-aligned between the two different electrodes by induction of the electric field generated due to a potential difference between the two electrodes. Therefore, as the intensity of the electric field increases, the number of the nano-scale LED devices connected with the two electrodes may increase. Also, the intensity of the electric field may be proportional to the potential difference V between the two electrodes, and be inversely proportional to the distance Z between the two electrodes.

Next, as the concentration C (% by weight of the nano-scale LED devices) of the dispersion solution including the nano-scale LED devices increases, the number of the LED devices connected to the two electrodes may increase.

Subsequently, in case of the frequency H (Hz) of the power source, since a difference in charges generated in the nano-scale LED devices varies according to the frequency, the number of the nano-scale LED devices connected to the two electrodes may increase with an increased frequency. However, since charges may not be induced when the frequency is greater than a predetermined value, the number of the nano-scale LED devices connected to the two electrodes may decrease.

Finally, when the aspect ratio of the nano-scale LED device increases, the charges induced by the electric field increase. Therefore, a larger number of the nano-scale LED devices may be aligned. Also, in considering the electrode line has a limited area in a spatial aspect for alignment of the nano-scale LED devices, in a state in which the nano-scale LED devices have a fixed height, the diameter of the nano-scale LED devices may decrease. Therefore, when the aspect ratio increases, the number of the nano-scale LED devices to be connected to the two electrode lines having a limited area may increase.

In the present invention, a variety of the above-described factors may be controlled to adjust the number of the LED devices connected to the two electrodes according to purpose.

Preferably, the number of the nano-scale LED devices per area (100×100 μm$^2$) of the electrode line on which the nano-scale LED devices may be substantially mounted may be in a range of 2 to 100,000, more preferably in a range of 10 to 10,000. Since the plurality of nano-scale LED devices are included in one nano-scale LED electrode assembly of the present invention, functional degradation or loss of the nano-scale LED electrode assembly may be minimized due to the malfunction of some of the plurality of nano-scale LED devices. Also, when the number of the nano-scale LED devices is greater than 100,000, manufacturing costs may increase, and it may be difficult to align the nano-scale LED devices.

Next, in the nano-scale LED electrode assembly manufactured by self-aligning the nano-scale LED devices in operation 1, the dispersion solvent included in the dispersion solution may be removed using a rapid thermal annealing (RTA) method. Rapid thermal annealing is a method of thermally annealing a dispersion solution at a high temperature for a short period of time. Thus, the dispersion solvent may be removed through the rapid thermal annealing method. In this way, the light emitting efficiency of the nano-scale LED device according to the present invention may be improved, and defects that may occur when an electroplating method is performed to form a metal ohmic layer in operation 2 as will be described below may be prevented due to removal of impurities. When an ohmic layer capable of improving electrical connectivity between both ends of the nano-scale LED device and the electrodes and reducing contact resistance is formed in the nano-scale LED electrode assembly manufactured by performing processes subsequent to operation 2 as will be described below without performing a rapid thermal annealing method, the ohmic layer may be poorly formed, a desired level of light emitting efficiency may not be expressed, and heavy loss of electric current may occur.

Meanwhile, the rapid thermal annealing method may be performed again before operation 2 or after operation 3. In this way, electrical connectivity between the both ends of the nano-scale LED devices and the electrodes may be further improved.

Figure 11:
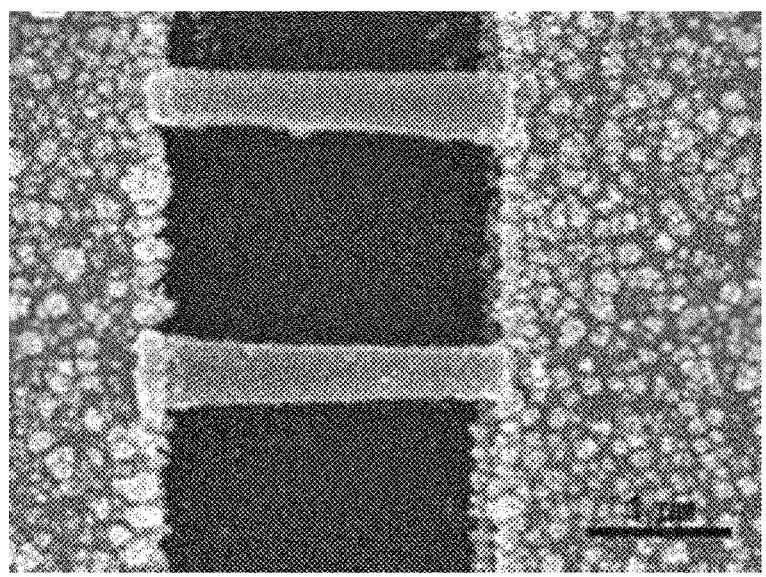
FIG. 11 is a scanning electron microscope (SEM) image of a nano-scale LED electrode assembly in which a metal ohmic layer is formed without performing a rapid thermal annealing method according to one preferred embodiment of the present invention.
Figure 12:
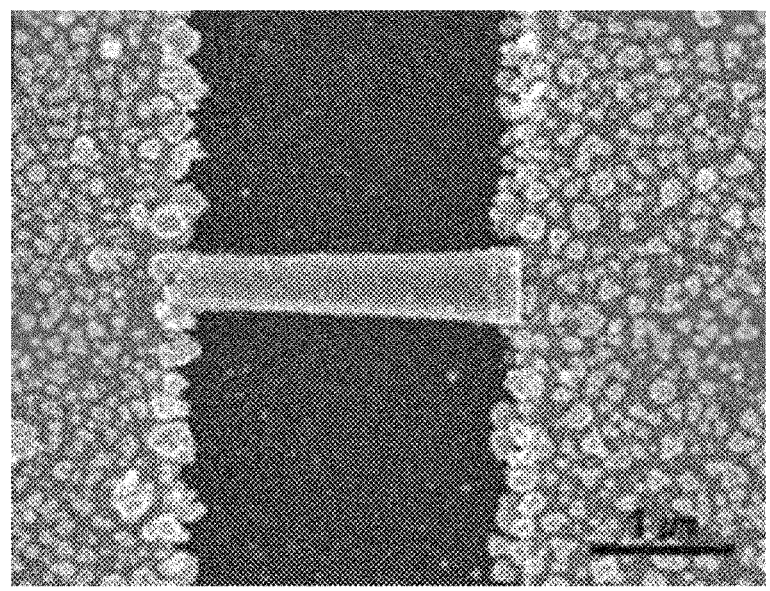
FIG. 12 is an SEM image of a nano-scale LED electrode assembly in which a metal ohmic layer is formed after performing a rapid thermal annealing method according to one preferred embodiment of the present invention.

Specifically, FIG. 11 is an SEM image of a nano-scale LED electrode assembly after performing operations 2 and 3, and FIG. 12 is an SEM image of a nano-scale LED electrode assembly which is subjected to a rapid thermal annealing method after performing operations 2 and 3. Comparing FIGS. 11 and 12, the nano-scale LED devices and the electrodes are coated with Au nanoparticles, and contact points between the electrodes and the nano-scale LED devices are filled with the Au nanoparticles in both cases. However, it can be seen that a level of the filling Au nanoparticles is significant in FIG. 12, compared to that in FIG. 11, as observed with the naked eye.

The rapid thermal annealing method may be performed by thermally annealing the nano-scale LED electrode assembly at 600° C. to 1,000° C. for 0.5 to 10 minutes, preferably for 1 to 7 minutes. When the rapid thermal annealing is performed at a temperature of less than 600° C. and/or for a time of less than 0.5 minutes, impurities may not be completely removed, and a contact reaction between the nano-scale LED devices and the electrodes may not occur at all. On the other hand, when the rapid thermal annealing is performed at a temperature of greater than 1,000° C. and/or for a time of greater than 10 minutes, the base substrate and/or the electrodes may be deformed or broken, and a voltage may not be normally applied to the nano-scale LED devices due to an increase in resistance.

Finally, operation 2 of the method of manufacturing a nano-scale LED electrode assembly including a selective metal ohmic layer according to the present invention includes immersing the nano-scale LED electrode assembly in an electroplating solution, and forming a metal ohmic layer on the nano-scale LED electrode assembly by applying a power source to one of the first and second electrodes of the nano-scale LED electrode assembly to perform an electroplating process for a plating time $T_1$ of 1 to 300 minutes, preferably 5 to 200 minutes, and more preferably 10 to 55 minutes.

Operation 2 may be performed using an electroplating process. The term "electroplating process" refers to a process in which, when a power source is applied between an anode and a cathode, an oxidation reaction occurs at the anode and a reduction reaction occurs at the cathode so that a material in the cathode is coated with a metal. In this case the cathode and the anode may be immersed in an electroplating solution. Here, metals to be plated onto the cathode in the electroplating solution may be present in an ionic state.

Specifically, operation 2 of the present invention may be performed using the electroplating process, and thus will be described with reference to FIG. 10, as follows.

Figure 10:
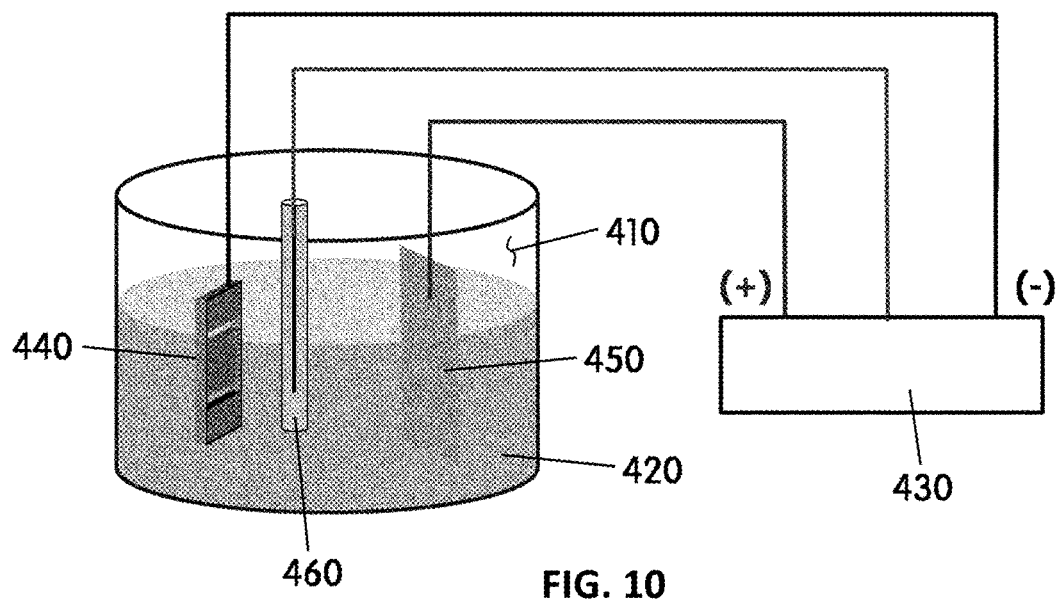
FIG. 10 is a diagram of an electroplating process performed to form a metal ohmic layer according to one preferred embodiment of the present invention.

FIG. 10 is a diagram of an electroplating process performed to form a metal ohmic layer according to one preferred embodiment of the present invention.

First, an electrolytic bath 410 containing an electroplating solution 420 is prepared. The electroplating solution 420 may include a metal precursor in the form of an ionic compound, deionized water, and an additive.

Next, a working electrode 440, a reference electrode 460 and a counter electrode 450 are immersed in the electroplating solution 420. The nano-scale LED electrode assembly according to the present invention may be used as the working electrode 440.

Subsequently, the nano-scale LED electrode assembly of the present invention used as the working electrode 440, the reference electrode 460, and the counter electrode 450 are electrically connected to a power source 430. The counter electrode 450 is connected to a positive pole (+) of the power source 430, and the first electrode or second electrode of the nano-scale LED electrode assembly according to the present invention is connected to a negative pole (−) of the power source 430. Thereafter, a power source is applied for a plating time $T_1$ of 1 to 300 minutes, preferably 5 to 200 minutes, and more preferably 10 to 55 minutes to deposit a metal precursor onto one surface of the nano-scale LED electrode assembly, preferably surfaces of the plurality of nano-scale LED devices, thereby forming a metal ohmic layer. When the power source is applied for less than 1 minute, a metal ohmic layer may not be sufficiently formed on one surface of the electrode line on which the plurality of nano-scale LED devices are self-aligned. On the other hand, when the power source is applied for greater than 300 minutes, shorts may occur on the electrodes.

In this case, the power source 430 applied to form a superior metal ohmic layer may be pulse waves having a voltage of −0.2 to −1.0 V. Here, the pulse waves of the power source may be applied for 0.05 to 30 seconds, more preferably 1 to 10 seconds, and paused for 0.05 to 30 seconds, more preferably 1 to 10 seconds. However, conditions for applying/pausing such pulse waves are not limited.

When the metal ohmic layer is formed through operation 2, a metal ohmic layer may be formed only on the first or second electrode to which the power source 430 is electrically connected, or a first metal ohmic layer may be formed on the first and second electrodes. In the case of the former, since a metal ohmic layer is not formed on the first or second electrode to which the power source 430 is not connected, operation 3 may be performed to uniformly form a metal ohmic layer on the entire surface of the electrode line.

Operation 3 may include forming a metal ohmic layer on the nano-scale LED electrode assembly by applying a power source to a counter electrode of the first or second electrode to which the power source is applied in operation 2 to perform an electroplating process for a plating time $T_2$ satisfying the following Mathematical Expression 1.

$$1 \text{ Minute} \leq \text{Plating time } T_2 \leq T_1 \qquad \text{[Mathematical Expression 1]}$$

wherein $T_1$ represents a plating time for the electroplating process in operation 2.

Operation 3 may be performed in the same manner in as operation 2 using an electroplating process. Thus, the counter electrode 450 may be connected to a positive pole (+) of the power source 430, and a counter electrode of the first or second electrode to which the power source in operation 2 is applied in the electrode line of the nano-scale LED electrode assembly according to the present invention may be connected to a negative pole (−) of the power source 430. Thereafter, a power source may be applied for a plating time $T_2$ satisfying Mathematical Expression 1 to deposit a metal precursor on one surface of the nano-scale LED electrode assembly, preferably the electrode line on which the plurality of nano-scale LED devices are self-aligned, thereby forming a metal ohmic layer. In this case, the power source 430 applied to form a metal ohmic layer capable of exhibiting superior physical properties may be pulse waves having a voltage of −0.2 to −1.0 V. Here, the power source of pulse waves may be applied for 0.05 to 30 seconds, more preferably 1 to 10 seconds, and may be paused for 0.05 to 30 seconds, more preferably 1 to 10 seconds. However, conditions for applying/pausing such pulse waves are not limited. Also, it is desirable to perform this operation for a plating time $T_2$ of preferably 4 minutes, more preferably 8 minutes so as to manufacture a nano-scale LED electrode assembly having superior physical properties.

Figure 13:
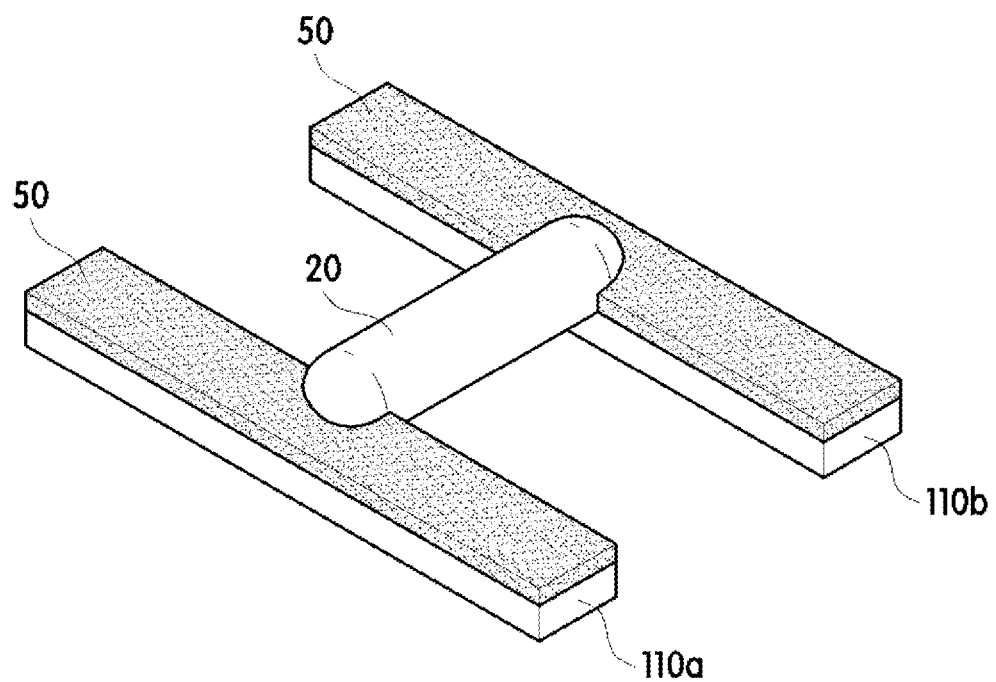
FIGS. 13 and 14 are diagrams showing a metal ohmic layer formed on one surface of the electrode line on which the nano-scale LED devices are self-aligned according to one preferred embodiment of the present invention.
Figure 14:
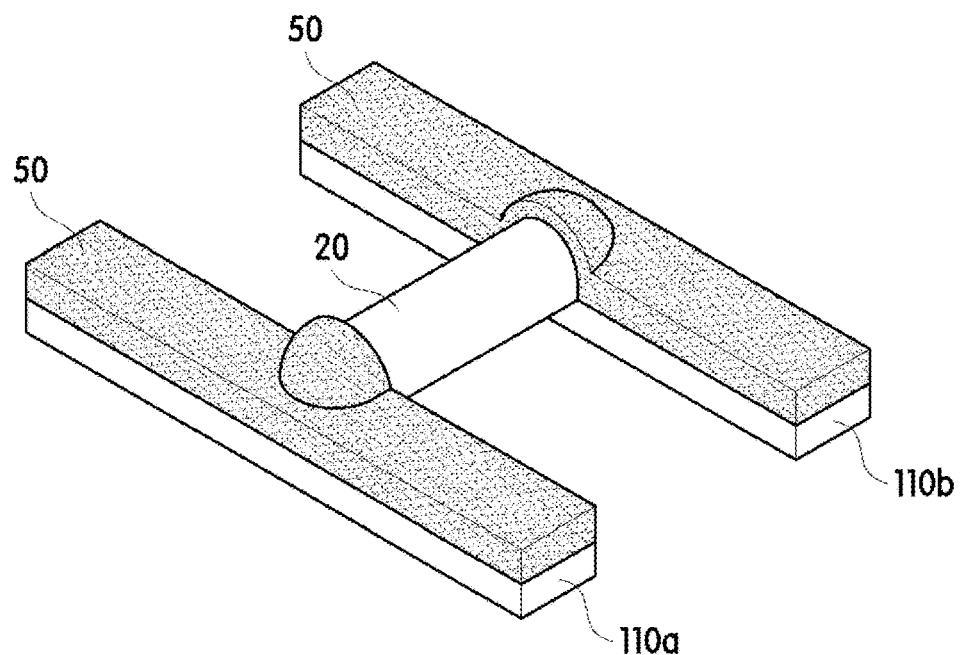

As described above, the metal ohmic layer may be formed by depositing a metal precursor included in the electroplating solution onto the electrode line through a reduction reaction of the electrode line in the nano-scale LED electrode assembly. In this case, the metal ohmic layer 50 may be formed on one surface of the nano-scale LED electrode assembly, preferably surfaces of the electrode lines 110a and 110b on which the nano-scale LED devices 20 are self-aligned, as shown in FIGS. 13 and 14.

As such, a reason for forming the metal ohmic layer on surfaces of the electrode lines 110a and 110b on which nano-scale LED devices 20 are self-aligned is because the plurality of nano-scale LED devices 20 emit light when the power source is applied to the first electrode 110a and the second electrode 110b to which the plurality of nano-scale LED devices are connected. In this case, contact resistance that may occur between the nano-scale LED devices 20 and the first and second electrodes 110a and 110b may be reduced.

The term "contact resistance" refers to electric resistance that occurs on a contact surface of two adjacent conductors when an electric current is allowed to flow through the contact surface of the two conductors. Here, when two conductors come in contact with each other to send an electric current, a voltage applied to a contact region between the conductors drops, causing an increase in temperature. In other words, the term "contact resistance" refers to electric resistance that occurs in a contact region between the plurality of nano-scale LED devices 20 and the first and second electrodes 110a and 110b, which are adjacent to each other, when an electric current is allowed to flow through the contact region from the power source applied to the metal line. In this case, a voltage applied to the contact region drops, causing an increase in temperature.

Since the metal ohmic layer 50 is selectively formed to include a contact region between the nano-scale LED device 20 and the first electrode 110a and a contact region between the nano-scale LED device 20 and the second electrode 110b, the contact between the nano-scale LED devices 20 and the first and second electrodes 110a and 110b may be improved. Also, since the metal ohmic layer 50 is formed of a conductive material, conductivity between the nano-scale LED devices 50 and the first and second electrodes 110a and 110b may be increased, and contact resistance may also be reduced.

As described above, an additive may be included in the electroplating solution. In this case, a leveler for leveling the metal ohmic layer 50, a grain refiner for refining grains of the metal ohmic layer 50, a stress reducer for reducing stress in the metal ohmic layer 50 while the metal ohmic layer 50 is formed on surfaces of the electrode lines 110a and 110b, and a wetting agent for promoting adhesion of metal elements of a metal ionic compound to one surface of the electrode line may be used as additives.

Meanwhile, the metal precursor may include one or more selected from the group consisting of a gold precursor, a silver precursor, a copper precursor, and a platinum precursor. That is, when the gold precursor is included in the electroplating solution, a gold material may be used to form a metal ohmic layer on one surface of the electrode line on which the nano-scale LED devices are self-aligned. When the silver precursor is included in the electroplating solution, a silver material may be used to form a metal ohmic layer on one surface of the electrode line on which the nano-scale LED devices are self-aligned.

Types of the gold precursor usable in the present invention may include $HAuCl_4$, $KAuCl_4$, etc., types of the silver precursor may include $KAg(CN)_2$, $NaAg(CN)_2$, $AgCN$, $AgOCN$, $AgNO_3$, $AgCO_3$, $C_2H_3AgO_3$, etc., and types of the copper precursor may include $CuCN$, $Cu(NO_3)_2$, $CuCO_3$, Cu$_2$(OAc)$_4$, CuSO$_4$, etc. Also, types of the platinum precursor may include H$_2$PtCl$_6$, etc.

However, the metal precursor of the present invention is not limited to the above metal precursors, and all types of metal precursors may be used as long as they can be used as a plating material in an electroplating process.

Further, the electroplating solution may include the metal precursor at a concentration of 0.001 to 100 mM, more preferably 0.01 to 100 mM, and most preferably 0.01 to 50 mM.

When the concentration of the metal precursor is less than 0.001 mM, insufficient deposition may occur. On the other hand, when the concentration of the metal precursor is greater than 100 mM, excessive deposition may occur, resulting in shorts in the nano-scale LED electrode assembly.

Meanwhile, operations 2 and/or 3 may be performed at a temperature of 10 to 30° C., preferably a temperature of 15 to 25° C. When the temperature is less than 10° C., the metal ohmic layer may not be sufficiently formed. On the other hand, when the temperature is greater than 30° C., a metal forming a metal ohmic layer may be formed in an oxidized state, and shorts may also occur in the nano-scale LED electrode assembly.

Although the present invention has been described with reference to exemplary embodiments thereto, it should be understood that the following examples are merely preferred examples for the purpose of illustration only and is not intended to limit or define the scope of the invention. Also, it will be apparent to those skilled in the art to which the present invention belongs that various modifications and changes can be made without departing from the scope of the present invention. For example, components specifically described in exemplary embodiments of the present invention may be modified to implement the present invention. Also, it should be understood that that differences associated with such modifications and changes are intended to be encompassed in the scope of the present invention defined by the appended claims and their equivalents.

Hereinafter, the present invention will be described in further detail with exemplary embodiments thereto. However, it should be understood that following examples are not intended to limit the scope of the present invention, but intended to aid in understanding the present invention.

Comparative Example 1

An electrode line was formed on a base substrate formed of a quartz material and having a thickness of 850 μm, as shown in FIG. 2. In this case, in the electrode line, the width of the first electrode was 3 μm, the width of the second electrode was 3 μm, the distance between the first electrode and the second electrode adjacent to the first electrode was 2 μm, and the thickness of the electrode was 0.2 μm. Also, the first electrode and the second electrode were formed of a material such as titanium/gold, and an area of a region in which nano-scale LED devices were mounted in the electrode line was 4.2×10$^7$ μm$^2$.

Next, 1.0 parts by weight of nano-scale LED devices, with specifications listed in the following Table 1 and having a structure as shown in FIG. 6 and in which a portion of an active layer of each of the nano-scale LED devices was coated with an insulating coating film as listed in the following Table 1, was mixed with 100 parts by weight of acetone to prepare a dispersion solution including the nano-scale LED devices.

The prepared dispersion solution was dropped onto a region of the electrode line, and a power source having a voltage V$_{Ac}$ of 30 V and a frequency of 950 kHz was then applied to the electrode line for 1 minute to manufacture a nano-scale LED assembly.

TABLE 1

| | Material | Height (μm) | Diameter (μm) |
|---|---|---|---|
| First electrode layer | Chromium | 0.03 | 0.6 |
| First conductive semiconductor layer | n-GaN | 1.64 | 0.6 |
| Active layer | InGaN | 0.1 | 0.6 |
| Second conductive semiconductor layer | p-GaN | 0.2 | 0.6 |
| Second electrode layer | Chromium | 0.03 | 0.6 |
| Insulating coating film | Aluminum oxide | | thickness 0.02 |
| Nano-scale LED device | — | 2 | 0.62 |

Comparative Example 2

The nano-scale LED electrode assembly manufactured in Comparative Example 1 was thermally annealed at a temperature of 810° C. for 2 minutes to manufacture a nano-scale LED electrode assembly.

Example 1

An electroplating process was described with reference to FIG. 10. First, an electroplating solution 420 was injected into an electrolytic bath 410. The electroplating solution 420 was prepared at a concentration of 0.05 mM by diluting HAuCl$_4$ (Sigma-Aldrich Co. LLC., 99.99% trace metals basis, 30% by weight in dilute HCl) with deionized water. Next, a working electrode 440, a reference electrode 460, and a counter electrode 450 were immersed in the electroplating solution 420. The nano-scale LED electrode assembly manufactured in Comparative Example 2 was used as the working electrode 440, an Ag/AgCl electrode was used as the reference electrode, and a Pt plate was used as the counter electrode. Thereafter, the working electrode 440, the reference electrode 460 and the counter electrode 450 were electrically connected to a power source 430. In this case, the counter electrode 450 was connected to a positive pole (+) of the power source 430, and a first electrode of the nano-scale LED electrode assembly manufactured in Comparative Example 2 used as the working electrode 440 was connected to a negative pole (−) of the power source 430. Then, the power source 430 was applied for 25 minutes in the form of pulse waves having a voltage of −0.2 V. One cycle of applying the power source 430 for 2 seconds and pausing the power source 430 for 2 seconds was repeated to manufacture a nano-scale LED electrode assembly having a metal ohmic layer formed therein.

Example 2

A metal plating process was performed on the nano-scale LED electrode assembly manufactured in Example 1 in the same manner in as in Example 1. However, the counter electrode 450 was connected to a positive pole (+) of the power source 430, and a second electrode of the nano-scale LED electrode assembly manufactured in Example 1 was connected to a negative pole (−) of the power source 430. Thereafter, the power source 430 was applied for 25 minutes in the form of pulse waves having a voltage of −0.2 V. One cycle of applying the power source 430 for 2 seconds and pausing the power source 430 for 2 seconds was repeated to manufacture a nano-scale LED electrode assembly having a metal ohmic layer formed therein.

Experimental Example 1

Figure 15:
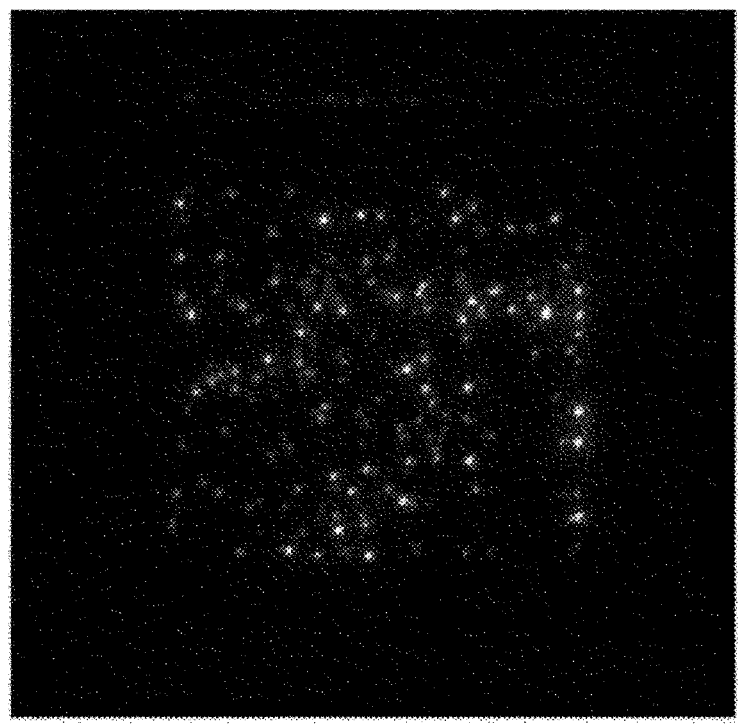
FIG. 15 is a blue electroluminescent image of a nano-scale LED device for a nano-scale LED electrode assembly according to Comparative Example 1 of the present invention.
Figure 16:
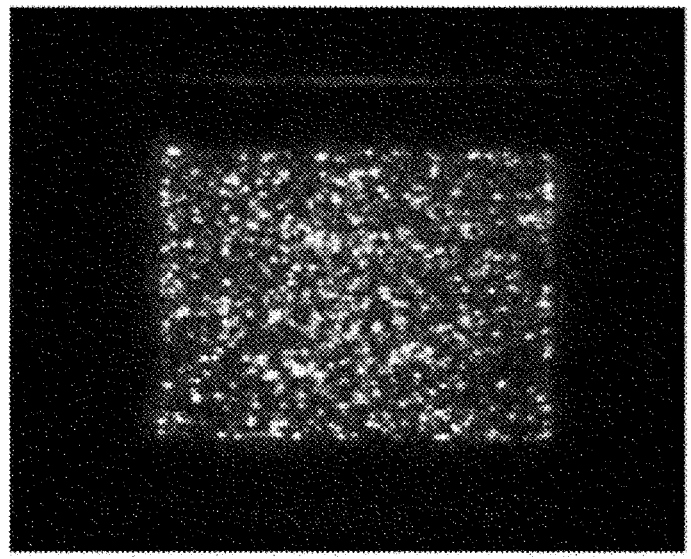
FIG. 16 is a blue electroluminescent image of a nano-scale LED device for a nano-scale LED electrode assembly according to Comparative Example 2 of the present invention.
Figure 17:
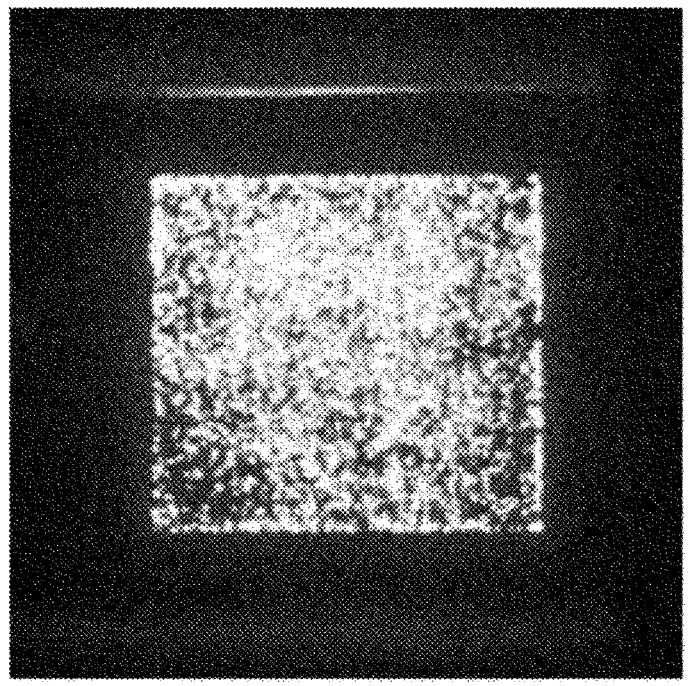
FIG. 17 is a blue electroluminescent image of a nano-scale LED device for a nano-scale LED electrode assembly according to Example 1 of the present invention.
Figure 18:
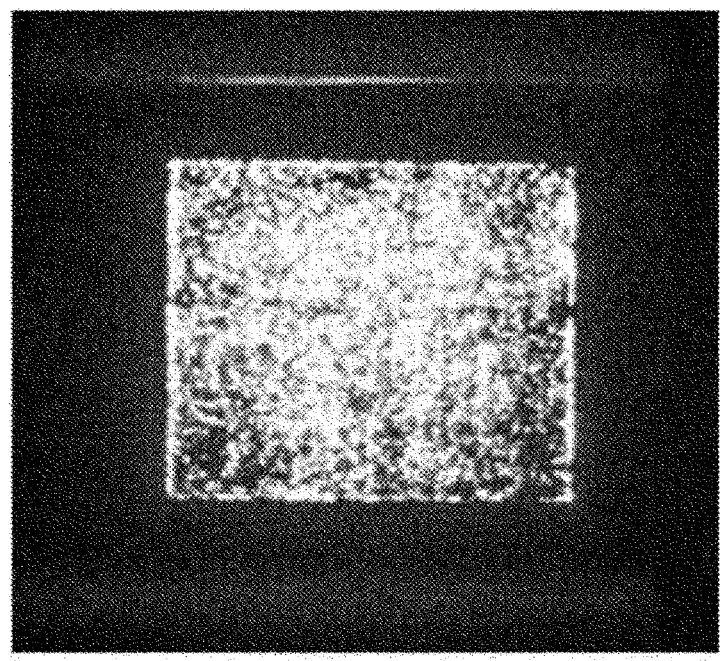
FIG. 18 is a blue electroluminescent image of a nano-scale LED device for a nano-scale LED electrode assembly according to Example 2 of the present invention.

For the nano-scale electrode assemblies manufactured in Comparative Examples 1 and 2 and Examples 1 and 2, the nano-scale LED devices emitting blue light were observed by applying an AC power source having a voltage VAC of 30 V and a frequency of 950 kHz to the electrode line for 1 minute. FIG. 15 is a blue electroluminescent image for the nano-scale electrode assembly manufactured in Comparative Example 1, FIG. 16 is a blue electroluminescent image for the nano-scale electrode assembly manufactured in Comparative Example 2, FIG. 17 is a blue electroluminescent image for the nano-scale electrode assembly having a metal ohmic layer formed therein manufactured in Example 1, and FIG. 18 is a blue electroluminescent image for the nano-scale LED electrode assembly having a metal ohmic layer formed therein manufactured in Example 2.

Referring to FIGS. 15 to 18, it could be seen that the blue electroluminescence for the nano-scale electrode assembly manufactured in Comparative Example 2 had superior light emitting efficiency to the blue electroluminescence for the nano-scale electrode assembly manufactured in Comparative Example 1. Specifically, it could be seen that the light emitting efficiency of the nano-scale electrode assembly manufactured in Comparative Example 2 was approximately 3.74 times the light emitting efficiency of the nano-scale electrode assembly manufactured in Comparative Example 1.

Accordingly, it could be seen that acetone used as the dispersion solvent was removed when the nano-scale electrode assembly manufactured in Comparative Example 1 was thermally annealed, and the light emitting efficiency of the nano-scale electrode assembly was enhanced as the electrical connectivity between the nano-scale LED devices and the electrodes was further improved.

Also, it could be seen that the blue electroluminescence for the nano-scale electrode assembly having a metal ohmic layer formed therein manufactured in Example 1 had superior light emitting efficiency to the blue electroluminescence for the nano-scale electrode assemblies manufactured in Comparative Examples 1 and 2. Specifically, it could be seen that the light emitting efficiency of the nano-scale electrode assembly having a metal ohmic layer formed therein manufactured in Example 1 was approximately 15 times the light emitting efficiency of the nano-scale electrode assembly manufactured in Comparative Example 1, and approximately 4 times the light emitting efficiency of the nano-scale electrode assembly manufactured in Comparative Example 2.

Accordingly, it could be seen that, when an electroplating process was performed on the nano-scale electrode assembly to form a metal ohmic layer, conductivity between the nano-scale LED devices and the electrode line was enhanced, and contact resistance was reduced, resulting in improved light emitting efficiency.

Finally, it could be seen that the blue electroluminescence for the nano-scale LED electrode assembly having a metal ohmic layer formed therein manufactured in Example 2 had superior light emitting efficiency to the blue electroluminescence for the nano-scale LED electrode assembly having a metal ohmic layer formed therein manufactured in Example 1. Specifically, it could be seen that the light emitting efficiency of the nano-scale LED electrode assembly having a metal ohmic layer formed therein manufactured in Example 2 was approximately 1.2 times the light emitting efficiency of the nano-scale electrode assembly manufactured in Example 1.

Accordingly, it could be seen that, when a power source was applied to the first electrode in the electrode line, as described in Example 1, to form a metal ohmic layer, the metal ohmic layer was not formed on the second electrode, or the formed metal ohmic layer did not serve to reduce contact resistance between the nano-scale LED devices and the second electrode. Therefore, it was revealed that the light emitting efficiency of the nano-scale LED electrode assembly was able to be improved in Example 2 when the power source was connected to the second electrode in the electrode line in the same manner in as in Example 1 to re-form a metal ohmic layer.

Comparative Example 3

A nano-scale LED electrode assembly was manufactured in the same manner as in Comparative Example 1, except that a green nano-scale LED device as detailed the following Table 2 was used instead of the nano-scale LED device of Table 1.

Example 3

A nano-scale LED electrode assembly was manufactured in the same manner as in Example 2, except that a green nano-scale LED device as detailed in the following Table 2 was used instead of the nano-scale LED device of Table 1.

TABLE 2

| | Material | Height (μm) | Diameter (μm) |
|---|---|---|---|
| First electrode layer | Chromium | 0.15 | 0.50 |
| First conductive semiconductor layer | n-GaN | 4 | 0.50 |
| Active layer | InGaN/GaN | 0.2 | 0.50 |
| Second conductive semiconductor layer | p-GaN | 0.15 | 0.50 |
| Second electrode layer | Chromium | 0.03 | 0.50 |
| Insulating coating film | Aluminum oxide | | thickness 0.02 |
| Nano-scale LED device | — | 4.53 | 0.52 |

Experimental Example 2

The electroluminescence (EL) intensities of light emitted from the nano-scale electrode assemblies manufactured in Comparative Example 3 and Example 3 were measured when a varying drive voltage ranging from 0 to 21.0 $V_{rms}$ was applied to the electrode line at a frequency of 60 Hz. The results are shown in FIGS. 19 and 20.

Figure 19:
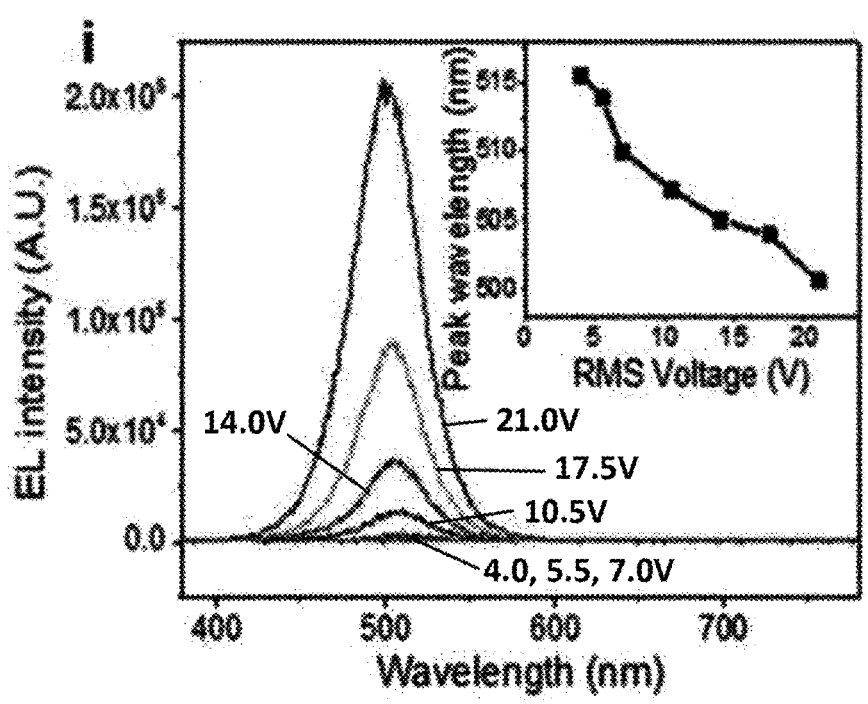
FIGS. 19 and 20 are graphs showing electroluminescence (EL) intensities measured while changing an alternating current (AC) voltage used to drive nano-scale LED electrode assemblies according to Comparative Example 3 and Example 3, respectively.
Figure 20:
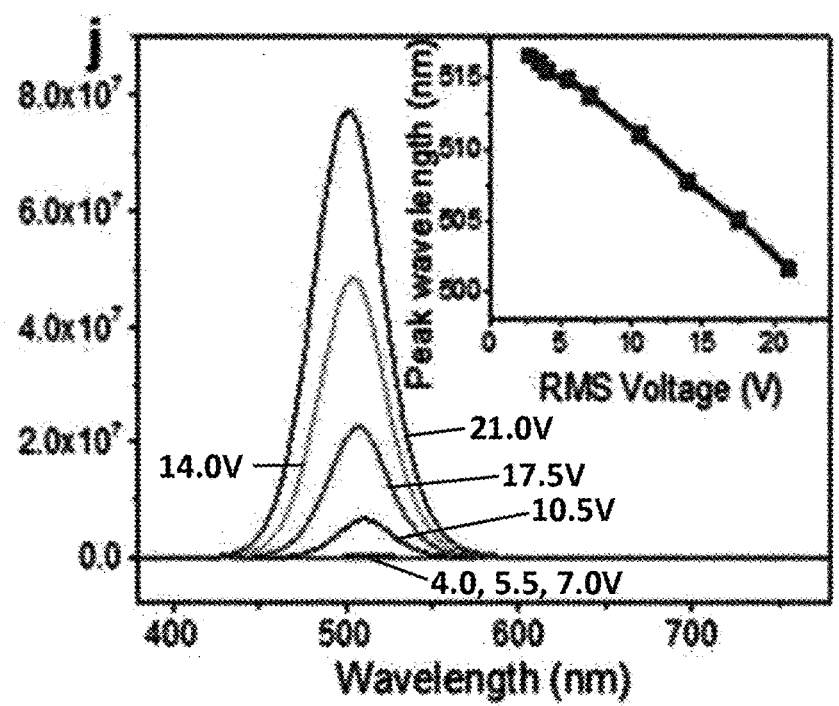

FIG. 19 is a graph showing EL intensities of the nano-scale LED electrode assembly manufactured in Comparative Example 3 according to the varying drive voltage, and FIG. 20 is a graph showing EL intensities of the nano-scale LED electrode assembly manufactured in Example 3 according to the varying drive voltage.

Specifically, referring to FIG. 19, it could be seen that green light was emitted in a minimum voltage range of 4.0 to 5.5 $V_{rms}$, but that green light was also emitted in a voltage range 2.8 to 3.5 $V_{rms}$, which is significantly lower than the minimum voltage range as shown in FIG. 20. Therefore, it was revealed that the contact resistance was significantly reduced and the electrical connectivity of an electrical contact region was significantly increased due to the rapid thermal annealing process and the formation of the metal ohmic layer. Also, it was revealed that the electroluminescence intensity which increased with an increasing voltage was significantly higher in the nano-scale LED electrode assembly as shown in FIG. 20, compared to that of the nano-scale LED electrode assembly as shown in FIG. 19. Specifically, it was revealed that the electroluminescence intensity at 21.0 $V_{rms}$ increased approximately 371 times.

Figure 21:
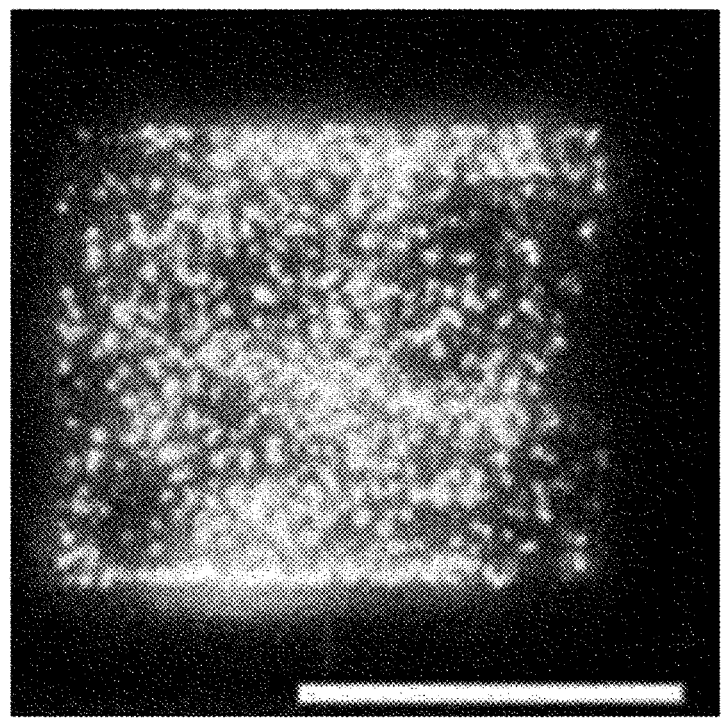
FIGS. 21 and 22 are images of the nano-scale LED electrode assemblies of Comparative Example 3 and Example 3 which emit light when an AC voltage is applied to the nano-scale LED electrode assemblies, respectively.
Figure 22:
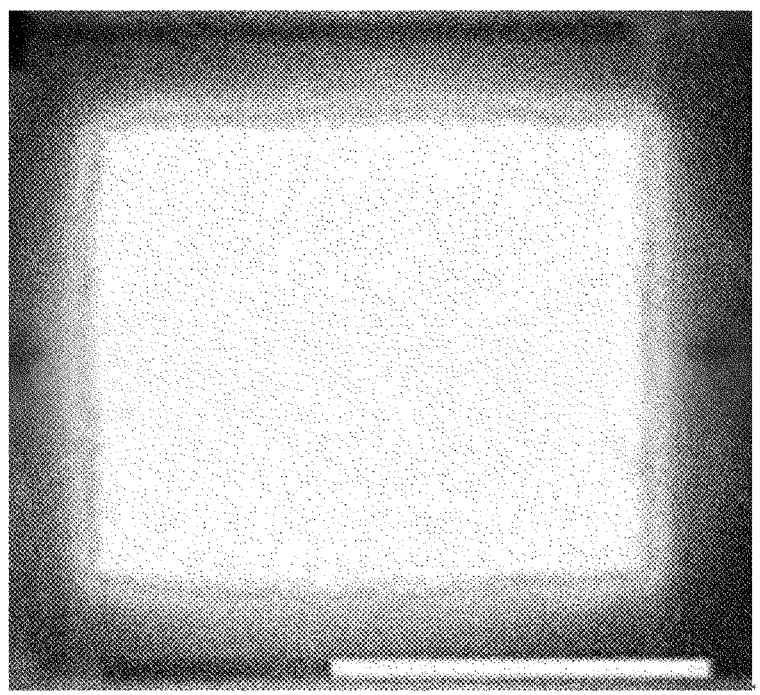

Meanwhile, FIGS. 21 and 22 are images of the nano-scale LED electrode assemblies manufactured in Comparative Example 3 and Example 3 which emit light when an AC power source having a voltage of 21.0 $V_{rms}$ is applied to the nano-scale LED electrode assemblies at a frequency of 60 Hz, respectively. As observed on the images with the naked eye, it could be seen that, even when the nano-scale LED devices were self-aligned on the electrode without performing a rapid thermal annealing process to increase an electrical connection or forming a selective ohmic layer, the nano-scale LED devices were connected to the electrode so that the light emission was observed with the naked eye, as shown in FIG. 21. However, it was revealed that a level of light emission was significantly higher in FIG. 22, compared to the level of light emission as shown in FIG. 21. From these results, it was expected that the contact resistance significantly decreased and the electrical connectivity significantly increased when the rapid thermal annealing process and the formation of the selective ohmic layer were performed at the same time.

The method of manufacturing a nano-scale LED electrode assembly according to the present invention can be useful in increasing conductivity between an LED device and electrodes and also reducing contact resistance therebetween by depositing a conductive material in a region in which the LED device comes in contact with the electrodes so as to improve the contact between the LED device and the electrodes, thereby further improving light extraction efficiency of the LED device.

It will be apparent to those skilled in the art that various modifications can be made to the above-described exemplary embodiments of the present invention without departing from the scope of the invention. Thus, it is intended that the present invention covers all such modifications provided they come within the scope of the appended claims and their equivalents.

What is claimed is:

1. A method of manufacturing a nano-scale LED electrode assembly comprising a selective metal ohmic layer, comprising:
   (1) manufacturing a nano-scale LED electrode assembly by self-aligning nano-scale LED devices on an electrode line comprising first and second electrodes which are formed on a base substrate to be spaced apart from each other;
   (2) forming a metal ohmic layer on the nano-scale LED electrode assembly at least including a contact region between nano-scale LED device and electrode line by immersing the nano-scale LED electrode assembly in an electroplating solution and applying a power source to one of the first and second electrodes of the nano-scale LED electrode assembly to perform an electroplating process for a plating time ($T_1$) of 1 to 300 minutes; and
   (3) forming a metal ohmic layer on the nano-scale LED electrode assembly by applying a power source to the other electrode, to which the power source is not applied in operation 2, to perform an electroplating process for a plating time T2 satisfying the following Mathematical Expression 1:

$$1 \text{ Minute} \leq \text{plating time } (T_2) \leq T_1 \quad \text{[Mathematical Expression 1]}$$

wherein $T_1$ represents a plating time required for the electroplating process in operation 2.

2. The method of claim 1, wherein the power source in operation 2 is applied in the form of pulse waves having a voltage of −0.2 to −1.0 V, and the power source of the pulse waves is applied for 0.05 to 30 seconds and paused for 0.05 to 30 seconds.

3. The method of claim 2, wherein the power source in operation 3 is applied in the form of pulse waves having a voltage of −0.2 to −1.0 V, and the power source of the pulse waves is applied for 0.05 to 30 seconds and paused for 0.05 to 30 seconds.

4. The method of claim 1, wherein the electroplating solution comprises at least one metal precursor selected from the group consisting of a gold precursor, a silver precursor, a copper precursor, and a platinum precursor metal precursor selected from the group consisting of a gold precursor, a silver precursor, a copper precursor, and a platinum precursor.

5. The method of claim 4, wherein the electroplating solution comprises the metal precursor at a concentration of 0.001 to 100 mM.

6. The method of claim 1, wherein operation 1 comprises:
   1-1) injecting a dispersion solution comprising a dispersion solvent and nano-scale LED devices toward one surface of the base substrate on which the electrode line comprising the first and second electrodes spaced apart from each other is formed; and
   1-2) manufacturing the nano-scale LED electrode assembly by applying the power source to the electrode line to self-align the nano-scale LED devices, wherein the manufactured nano-scale LED electrode assembly is thermally annealed at 600° C. to 1,000° C. for 0.5 to 10 minutes.

7. The method of claim 1, wherein operation 1 includes either spirally or interdigitatedly disposing the first and second electrodes to be spaced apart from each other.

8. The method of claim 1, wherein each of the nano-scale LED devices comprises a first electrode layer; a first conductive semiconductor layer formed on the first electrode layer; an active layer formed on the first conductive semiconductor layer; a second conductive semiconductor layer formed on the active layer; and a second electrode layer formed on the second conductive semiconductor layer, and
   each of the nano-scale LED devices further comprises an insulating coating film which coats an outer surface thereof.

9. The method of claim 8, wherein the insulating coating film is applied to cover the entire outer surface of the active layer.

10. The method of claim 9, wherein outer surfaces of the first and second electrode layers of the nano-scale LED devices are not coated with the insulating coating film.

11. The method of claim 1, wherein the plating time (T1) in operation 2 is in a range of 10 to 55 minutes.

12. The method of claim 8, wherein a width X of the first electrode, a width Y of the second electrode, a distance Z between the first electrode and the second electrode adjacent to the first electrode, and a height H of the nano-scale LED devices satisfy the following Relation 1:

$$0.5Z \leq H < X+Y+2Z \quad \text{[Relation 1]}$$

wherein 100 nm < X ≤ 10 μm, 100 nm < Y ≤ 10 μm, and 100 nm < Z ≤ 10 μm.

13. The method of claim 1, wherein operation 1 further comprises forming an insulating barrier on the base substrate to surround a region of the electrode line on which the plurality of nano-scale LED devices are positioned.

14. The method of claim 1, wherein, after operation 3, the manufactured nano-scale LED electrode assembly is thermally re-annealed at 600° C. to 1,000° C. for 0.5 to 10 minutes.

* * * * *